United States Patent [19]

Gallo

[11] Patent Number: 5,104,604
[45] Date of Patent: Apr. 14, 1992

[54] FLAME RETARDANT EPOXY MOLDING COMPOUND, METHOD AND ENCAPSULATED DEVICE METHOD OF ENCAPSULATING A SEMICONDUCTOR DEVICE WITH A FLAME RETARDANT EPOXY MOLDING COMPOUND

[75] Inventor: Anthony A. Gallo, Olean, N.Y.

[73] Assignee: Dexter Electronic Materials Div. of Dexter Corp., N.Y.

[21] Appl. No.: 590,247

[22] Filed: Sep. 28, 1990

Related U.S. Application Data

[63] Continuation-in-part of Ser. No. 418,757, Oct. 5, 1989, Pat. No. 5,041,254, which is a continuation-in-part of Ser. No. 258,547, Oct. 17, 1988, abandoned.

[51] Int. Cl.$^5$ .............................................. B29C 45/14
[52] U.S. Cl. .............................. 264/272.17; 264/331.12; 523/460
[58] Field of Search ............ 264/272.17, 272.13, 264/331.12; 523/460, 457

[56] References Cited

U.S. PATENT DOCUMENTS

| | | | |
|---|---|---|---|
| Re. 31,214 | 4/1983 | Petrow et al. | 524/411 |
| 2,879,257 | 3/1959 | Walter et al. | 260/45.9 |
| 3,856,890 | 12/1974 | Biddell | 260/897 |
| 3,860,523 | 1/1975 | Petrow et al. | 252/8.1 |
| 3,912,792 | 10/1975 | Touval | 260/863 |
| 3,915,926 | 10/1975 | Wambach | 260/40 |
| 3,920,459 | 11/1975 | Allen | 106/15 |
| 3,928,277 | 12/1975 | Wicker | 260/37 |
| 3,950,456 | 4/1976 | Newcombe | 260/880 |
| 3,983,185 | 10/1976 | Dorfman et al. | 260/863 |
| 4,006,114 | 2/1977 | Carlson | 260/28.5 |
| 4,024,318 | 5/1977 | Forster et al. | 428/519 |
| 4,075,154 | 2/1978 | Itoh et al. | 260/37 |
| 4,127,559 | 11/1978 | Newcombe | 260/47.75 |
| 4,137,212 | 1/1979 | Theyson et al. | 260/37 |
| 4,155,949 | 5/1979 | Kamiyama et al. | 260/857 |
| 4,205,142 | 5/1980 | Baer | 525/166 |
| 4,278,581 | 6/1981 | Nakazawa et al. | 260/29.6 |
| 4,282,136 | 8/1981 | Hunt et al. | 523/460 |
| 4,339,556 | 7/1982 | Baer | 523/220 |
| 4,417,018 | 11/1983 | Ogawa et al. | 524/261 |
| 4,544,688 | 10/1985 | Salensky et al. | 523/458 |
| 4,618,636 | 10/1986 | Muench et al. | 524/176 |
| 4,668,719 | 5/1987 | Kato et al. | 523/458 |
| 4,675,356 | 6/1987 | Miyata | 524/424 |
| 4,684,721 | 5/1987 | Wang et al. | 525/507 |
| 4,710,531 | 12/1987 | Dozzi et al. | 524/239 |
| 4,710,796 | 12/1987 | Ikeya et al. | 357/72 |
| 4,716,184 | 12/1987 | Kagawa | 523/460 |
| 4,725,638 | 2/1988 | Ellmann et al. | 524/377 |
| 4,743,044 | 5/1988 | Skipper et al. | 524/437 |

FOREIGN PATENT DOCUMENTS

| | | | |
|---|---|---|---|
| 123249 | 7/1982 | Japan | 523/457 |
| 143464 | 7/1986 | Japan | 523/460 |

*Primary Examiner*—James Lowe
*Attorney, Agent, or Firm*—Pennie & Edmonds

[57] ABSTRACT

A flame retardant epoxy molding compound comprises an epoxy, a hardener preferably of the novolac or anhydride type, a catalyst, a mold release agent, preferably a filler, preferably a colorant, preferably a coupling agent, an organic compound containing a higher percent of halogen (which can be part of the resin or the hardener), preferably the meta-brominated cresol epoxy novolac type, preferably containing at least about 0.5% of bromine by weight of the molding compound, a lower percent of sodium, preferably in the range of 0.03–0.06% by weight of the antimony peroxide, a lower percent of antimony pentoxide, preferably in the range of from less than about 0.8% by weight of the molding compound, and an amount of magnesium aluminum carbonate hydrate less than or about 4.0% by weight of the molding compound. The flame retardant epoxy compounds when used to encapsulate the semiconductor devices have improved high temperature stability and reliability compared to similar prior art molding compounds.

23 Claims, No Drawings

FLAME RETARDANT EPOXY MOLDING COMPOUND, METHOD AND ENCAPSULATED DEVICE METHOD OF ENCAPSULATING A SEMICONDUCTOR DEVICE WITH A FLAME RETARDANT EPOXY MOLDING COMPOUND

This is a continuation-in-part of application Ser. No. 418,757, filed Oct. 5, 1989, now U.S. Pat. No. 5,041,25, which is in turn a continuation-in-part of application Ser. No. 07/258,547, filed Oct. 17, 1988, now abandoned.

BACKGROUND OF THE INVENTION

Technical Field

The present invention relates to an improved method of encapsulating a semiconductor device by heat curing an encapsulating compound comprising an epoxy, a hardener, a catalyst, a mold release agent, optionally a filler, optionally a colorant, optionally a coupling agent and a flame retardant system around a semiconductor device. In the improvement, the flame retardant system comprises a lower percentage of antimony pentoxide, a lower percentage of sodium and an organic compound containing a higher percentage of halogen than prior art molding compounds.

In the improvement, molding compounds with an organic compound containing a higher percentage of halogen along with a lower percentage of antimony pentoxide and sodium and with a basic magnesium oxide compound has unexpected superior high temperature stability and reliability.

The present invention also relates to improved flame retardant thermo setting epoxy molding compounds of the type comprising an epoxy, a hardener, a catalyst, a mold release agent, optionally a filler, optionally a colorant, optionally a coupling agent and a flame retardant system wherein the flame retardant system comprises a lower percentage of antimony pentoxide, a lower percentage of sodium, an organic compound containing a higher percentage of halogen than prior art molding compounds and optionally a basic magnesium oxide compound to reduce corrosion of metal conductor lines and pads of the semiconductor device.

The present invention also, includes an improved encapsulated semiconductor device wherein the encapsulant is as described above, with as flame-retardant system comprising a lower percentage of antimony pentoxide, and sodium, an organic compound containing a higher percentage of halogen than prior art molding compounds and optionally a basic magnesium oxide compound to reduce corrosion of metal conductor lines and pads of the semiconductor device.

In all three instances the halogen-containing organic compound may be a separate ingredient, but is preferably a part of either the epoxy or the hardener. The halogen containing organic compounds can also be halogen-containing compounds which become chemically incorporated into the product of the epoxy resin and the hardener upon setting or part of other ingredients such as the lubricant or the colorant.

The terms "epoxy molding compounds" as used herein means epoxy molding compound conventionally known in the art including any material containing two or more reactive oxirane groups. For example, the epoxy molding compound may have two or more epoxy groups in one molecule, including glycidyl ether type such as, phenol novolac type, cresol novolac type and the like; glycidyl-ester type; alicyclic type; heterocylic type and halogenated epoxy resins, etc. The epoxy resins may be used either singly or as a mixture of two or more resins.

Similarly, the term "epoxy novolac molding compound" as used herein includes any phenol-derived and substituted phenol derived novolac hardener conventionally used as hardener for epoxy resins. For example, phenolic novolacs, and cresolic novolacs, are most suitable. The epoxy novolac molding compounds may be used either singly or as a mixture of two or more compounds.

The term "catalyst" as used herein means a catalyst appropriate to the hardener used to promote the curing of the present composition. Such catalysts include basic and acidic catalysts such as the metal halide Lewis acids, e.g., boron trifluoride, stannic chloride, zinc chloride and the like, metal carboxylate-salts such as stannous octoate and the like; and amines, e.g., triethylamine, imidazole derivatives and the like. The catalysts are used in conventional amounts such as from about 0.1 to 5.0% by weight of the combined weight of epoxy and hardener.

The term "mold release agents" as used herein means chemical agents commonly used to assist the release of the cured epoxy molding compounds from the mold. For example, carnauba wax; montanic acid ester wax; polyethylene wax; polytetrafluoroethylene wax; glyceral monostearate; metallic stearates; paraffin waxes and the like are suitable.

The term "fillers" as used herein means one or more of the conventional fillers such as silica, calcium carbonate, calcium silicate, aluminum oxide, glass fibers, clay, and the like. The preferred filler is silica or a mixture of predominantly silica with other filler(s). The fillers usually are used in at least 50 percent by weight of the molding compound.

The term "colorant" as used herein includes colorant commonly used in epoxy molding compound, such as carbon black, pigments, dyes and the like.

The term "coupling agent," as used herein means a coupling agent known to improve dry electrical properties of the compound. The coupling agents may be of the silane type, characterized by the formula $R'Si(OR)_3$; where $R'$ represents an organo-functional group such as amino, mercapto, vinyl, epoxy or methacryloxy, and OR represents a hydrolyzable alkoxy group attached to the silicon. Preferred coupling agents are described in U.S. Pat Nos. 4,042,550 and 3,849,187, of which the descriptions are incorporated herein by reference.

The term "halogen-containing organic compound" or "organic compound containing halogen", as used herein, includes organic compound in which the halogen is present from any source including halogenation of a component or its precursor (such as a monomer) or by addition of halogen-containing monomers by reactions in which the halogen is not completely removed.

The halogen-containing organic compound used in a flame retardant system is preferably of the reactive type and further preferably has, as halogen, chlorine or bromine. Exemplary halogenated organic compounds are those types of polyglycidyl ether of bromophenol-formaldehyde novolac, commercially sold by Nippon Kayaku under the tradename "BREN ™," those described in U.S. Pat. Nos. 4,042,550 and 4,282,136, of which the descriptions are incorporated herein by reference and include halogenated bisphenol A and derivatives of bisphenol A such as tetrabromobisphenol A, and glycidyl ethers of halogenated resins such as the diglycidyl ether of tetrabromobisphenol A.

Preferred is meta-brominated cresol epoxy novolac available from the Dow Chemical Co. under the tradename "Stable Bromine Cresol Epoxy Novolac" (71842.00L type or 71970.00 type, production no. R0544-41091-21-1. These are described in U.S. Pat. Nos. 4,727,119 and 4,731,423). The 71842.00L type is of the general formula:

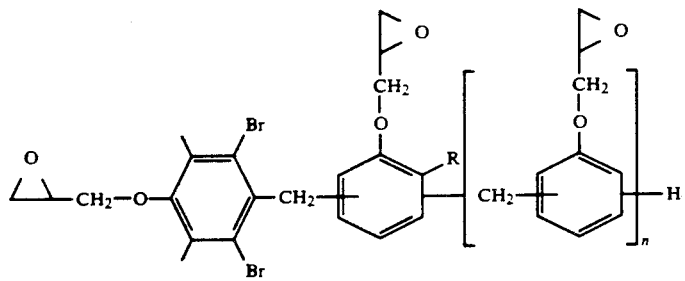

The 71970.00 type contains the following ingredients:

| | |
|---|---|
| Diglycidylether of Dibromotetramelthylbiphenol | 0-8% |
| Diglycidylether of Tribromotetramethylbiphenol Cas No. 108935-90-6 | 8-40% |
| Diglycidylether of Tetrabromotetramethylbiphenol Cas No. 72436-58-9 | 0-2% |
| Reaction product of cresol, formaldehyde & epichlorohydrin Cas No. 064425-89-4 | 60-90% |

The halogen containing organic compound may be a separate additive or may be contained in one or more of the organic components of the molding compound, especially the epoxy or the hardener, or possibly other components such as the lubricant, or the colorant or the filler (if organic).

Exemplary of reactive halogen-containing organic compounds which are part of the epoxy resin are meta-brominated phenolics such as meta-brominated cresol epoxy novolac.

The term "antimony pentoxide" as used herein means antimony pentoxide in any available form. Preferably, antimony pentoxide used is Nyacol A1590 commercially sold by the Nyacol Division of P.Q. Corporation which has a very low sodium content of 0.03 to 0.06% by weight of the antimony pentoxide as compared to that of 3 to 4% in prior art products such as Nyacol A1588LP.

The term "magnesium oxide compound" as used herein means any magnesium oxide in any available form capable of neutralizing the acidity of the antimony pentoxide and thereby reducing the corrosion of the metal semiconductor device lines and pads, especially in regions where two different metals are in contact with each other. Preferably, the magnesium oxide compound is magnesium aluminum carbonate hydrate commercially sold by Kyowa Chemical Industry Co. under the trade name "DHT-4A."

Description of Background Art

Epoxy resin compounds have often been used for encapsulation of semiconductor or device such as integrated circuits (IC), large scale integrated circuits (LSI), transistors and diodes, etc., or other electronic components. Such encapsulants generally comprise an epoxy, a hardener, a catalyst, a mold release agent, optionally a filler, optionally a colorant and sometimes a coupling agent.

Exemplary formulations of these ingredients are described in U.S. Pat. No. 4,710,796 to Ikeya et al., 4,282,136 to Hunt et al., U.S. Pat. No. 4,042,550 and references cited therein and in Raymond, T, Avoiding Bond Pad Failure Mechanisms in Au-Al Systems Semiconductor Int'l. p. 152-158, September 1989. Recently, the electronic industries require these epoxy molding compounds be flame retardant. Additives including halogenated compounds, transition metal oxides and hydrated alumina to improve the flame retardancy, as measured for example by Underwriters Laboratory Test 94V-0 of 1/16" bar have been reported. However, at high temperatures, these flame retardant additives detract from the compatibility of the encapsulated with semiconductor devices.

U.S. Pat. No. 4,710,796 to Ikeya et al. teaches a resin for encapsulating semiconductor device comprising an epoxy resin, curing agent, organic phosphine compound and at least one antimony oxide.

U.S. Pat. No. 4,042,550 teaches epoxyanhydride molding compounds with secondary fillers including antimony trioxide or antimony tetraoxide and halogenated compounds in flame retardant systems.

Similarly, U.S. Pat. No. 4,282,136 to Hunt et al. describes the use of synergistic flame retardants consisting of halogen-containing organic compounds and antimony pentoxide. The reference teaches that an encapsulant employing such a flame retardant system, when used to encapsulate a semiconductor device, has improved high temperature compatibility compared to similar molding compounds with antimony trioxide or antimony tetraoxide. However, the prior art epoxy molding compounds contains a high percent of sodium which is known to cause poor performance in semiconductor devices due to current leakage. See Moltzan et al., The Evolution of Epoxy Encapsulation Compounds For Integrated Circuits: A User's Perspective, Polymer for High Technology Electronics and Protronics, ACS Sym. Series No. 346, p.521, Sept. 7-12, 1986.

Raymond describes the necessity of IC manufacturers keeping Br in molding compounds at a low level (around 0.6-0.8%.) based on poor dry heat reliability results with a high Br compound (1.0%).

While the prior art flame retardant combinations provides reasonable flame retardance and satisfactory compatibility on electronic devices, a need clearly exists for flame retardant epoxy molding compounds of all types with improved compatibility, performance, cost and lower toxicity.

Accordingly, it is an object of the present invention to provide an improved flame retardant thermo setting epoxy molding compound.

It is yet another object of the present invention to provide an improved method of encapsulating a semiconductor device.

It is yet another object of the present invention to provide an improved encapsulated semiconductor device.

These and other objects of the invention, as well as a fuller understanding of the advantage thereof, can be had by reference to the following descriptions and claims.

SUMMARY OF THE INVENTION

The foregoing objects are achieved according to the present invention by an improved epoxy molding compound comprising:

(a) about 5-25 percent by weight of compound of an epoxy;

(b) about 4-20 percent by weight of compound of a phenol-derived or a substituted phenol derived resin hardener;

(c) an effective amount of a catalyst for the reaction between said epoxy resin and said hardener in an amount of from about 0.1 to 10% by weight of the combined weight of epoxy and hardener;

(d) an effective amount of a mold release agent for the release of the cured molding compound from a mold in an amount of between about 0.01 and about 2 percent by weight of composition;

(e) between about 50 and 85 percent by weight of composition of a filler; and (f) a flame retardant system of:
  (1) <about 0.8% antimony pentoxide by weight of molding compound;
  (2) from about 0.01-1% sodium by weight of antimony pentoxide; and
  (3) a reactive organic compound containing at least about 0.5% of bromine by weight of molding compound which may include one or more of the other components; and
  (4) ≦about 4.0% by weight of molding compound of a magnesium oxide compound which is most preferably magnesium aluminum carbonate hydrate.

Accordingly, Table 1 below summarizes the improved epoxy molding compounds.

TABLE 1

| Description Formulation (1): | Range (%) | Preferred Range (%) |
|---|---|---|
| Brominated epoxy resin | 5-25 | 10-17 |
| bromine content of molding compound (preferred reactive organic compound is Stable Bromide Cresol epoxy novolac) | at least about 0.5 | 1.0-1.8 |
| sodium (present in the antimony pentoxide) | 0.01-1 | 0.03-0.06 |
| antimony pentoxide | <0.80 | 0.40-0.80 |
| Magnesium aluminum carbonate hydrate | ≦4.0 | .02-3.20 |
| Carbon black colorant | 0.05-0.5 | 0.1-0.5 |
| Phenol Novolac Hardener | 4-20 | 4-12 |
| Fused Silica (SiO2) filler | 50-85 | 60-80 |
| silanes | 0.05-2.0 | 0.1-1.5 |
| catalysts | 0.01-10.0 | 0.5-2.0 |
| wax lubricants | 0.01-2 | 0.02-1.0 |

The improved epoxy molding compounds of the present invention are suitable for use in encapsulating a semiconductor device.

According to the present invention, the said improved epoxy molding compounds may be prepared by any conventional method. For example, the ingredients may be finely ground, dry blended and then densified on a hot differential roll mill, followed by granulation. Generally, the ingredients (or any portion of them) may be prepared as a fine powder, fed directly into a compounding device such as an extruder prepared as a premix of raw materials. If less than all of the ingredients are present in the initial form, the remainder of the ingredients can be added prior to or during densification.

Densification can be by mechanical compacting using a performer or a combining mill in the case of a fine powder, or by an extruder or differential roll mill in the case of the fine powders, direct feed or premix. Premixes or densified forms (such as preforms and granular forms), containing less than all of the ingredients can also be fed to the ultimate mold in the system with the remaining ingredients in a similar or different form.

The present invention includes flame retardant molding compounds in any physical form or even as systems of two or more components. Where two or more components are used, one should contain the epoxy, the other the hardener. Preferably, the catalyst is in the hardener component to avoid catalyzed homopolymerization of the epoxy.

In a preferred embodiment, in the laboratory, the dry ingredients of the formula are preground to a fine powder and then mixed in a large plastic bag. The liquid ingredients (i.e., the silane coupling agents) are added to dry ingredients and the mixture is mixed again by hand. The mixture is then treated on a large two-roll mill (one roll heated to about 90 C. and the other cooled with tap water) until a uniform sheet (about 6" wide by 24" long) is obtained. The sheet is allowed to cool and then ground to a fine powder.

In another preferred embodiment, in the pilot plant and during large scale production, the dry ingredients are mixed in a large hopper, the liquid ingredients are added in a homogeneous manner to ensure blending, and mixing continues. This mixture is then extruded (with heating) to give a continuous sheet which is cooled and grounded. The final ground powder can be used as is, or compacted (densified) in a preformer to give tablets (preforms) of desired shape and size.

These compounds may be molded into various articles by application of the appropriate temperature and pressure. For example, molding conditions for the encapsulated semiconductor of the present invention may range from about 300° to 400° F., (about 149°-204° C), preferably about 350° to about 375° F., (about 177°-191° C.), at 400 to 1,500 psi, (about 28 — 105 kg/cm$^2$), for a time ranging from about 30 to 120 seconds, preferably 60 to 90 seconds.

Any suitable molding apparatus may be employed, such as a transfer press equipped with a multi-cavity mold.

The ratio between the various ingredients may vary widely. In general, the epoxy will be in proportion to a novolac hardener so as to give a mole ratio of oxirane: reactive hydroxy between about 0.8 and 1.25. Similarly, the epoxy will be in proportion to an anhydride hardener so as to give a ratio of oxirane: anhydride equivalent between about 1.0 and 1.7, preferably between about 1.11 and 1.25.

The catalyst employed is generally applied at levels sufficient to harden the epoxy molding compound under anticipated molding conditions. Amounts between about 0.1 and 5 weight percent (by combined weight of epoxy and hardener) are sufficient.

The mold release agent will be employed in amounts sufficient to give good release from the mold and also to improve the dry electrical properties of the encapsulated semiconductor device. Amounts between about 0.01 and 2 percent by weight of total compound, preferably between about 0.02 and 1 percent by weight of total compound can be used.

The total amount of filler may range from 0 up to about 85 percent of the total compound. Preferably, the filler comprises a total of more than 50 weight percent of the total compound and more preferably between about 60 and about 85 weight percent of the total compound. Also, preferably, between about 60 and about 80 weight percent of the total compound is a silica filler.

Colorants, if employed, are generally in amounts sufficient to give encapsulated devices the desired color preferably black. Amounts between about 0.1–0.5% by weight of total compound can be employed.

Coupling agents, and in particular silane coupling agents, are provided in amounts sufficient to give the desired dry electrical properties and preferably between about 0.05 and 2 weight percent by total weight of compound, more preferably between about 0.1 and 1.5 weight percent by total weight of compound.

The epoxy molding compound obtained may be used to encapsulate semiconductor devices by any conventional method. For example, the preferred improved epoxy molding formulations comprising 0.4–0.8% percentage of antimony pentoxide; 0.03–0.06% sodium content (by weight of antimony pentoxide) and an organic compound containing about 1.0–1.8% . of bromine when molded on test devices have unexpected superior high temperature stability and reliability compared to prior art formulations as disclosed in U.S. Pat. No. 4,282,136 to Hunt et al.

The use of a lower percentage of antimony pentoxide in the present invention is preferred because antimony pentoxide is expensive and toxic.

Improved epoxy molding formulations comprising 0.4–0.8 percent of antimony pentoxide, 0.03–0.06 percent of sodium (by weight of antimony pentoxide) and an organic compound containing about 1.0–1.8 percent of bromine in high temperature storage life tests produce superior test results. The high temperature storage life test is routinely performed by semiconductor manufacturers to assess electrical reliability of the devices. In the high temperature storage life test, parametric shifts in voltage output levels are monitored. The temperature at which the semiconductor is stored may be varied. The voltage output levels reflect increased resistance across the ball-bonds of the devices.

The improved epoxy molding formulations are uniquely effective in delaying or eliminating the failure due to parameter shifts in voltage output levels of previous semiconductor devices. In the high temperature storage life test, Motorola SN 7420 devices were encapsulated in the improved epoxy molding compound. The improved epoxy molding compound shows no failure (greater than or equal to 400 mV at a constant 16 mA current) at 200° C. out to 880 hours and no failure (greater than or equal to 250 mV at a constant 16 mA current) at 200° C. out to 418 hours while comparable samples with BREN TM with or without DHT-4A shows at least 27% failure (greater than or equal to 400 mV and a constant 16 mA current) at 200° C. in 880 hours and at least 27% failure (greater than or equal to 250 mV at constant 16 mA current) at 200° C. in 418 hours.

Further, the improved epoxy molding compounds gave superior high temperature storage life test results than other combination containing BREN TM with or without DHT-4A when the temperature at which the semiconductors stored was varied at a constant voltage output level. In the high temperature storage life test, Advanced Micro Devices, Inc. 7400 Type TTL devices were encapsulated in the improved epoxy molding compound. At 185° C., the improved epoxy molding shows only 3% failure after 1800 hours while comparable samples with BREN TM with or without DHT-4A shows at least 98% failure after 1800 hours. At 200° C., the improved epoxy molding shows only 1% failure after 404 hours while comparable samples with BREN TM with or without DHT-4A show at least 76% failure after 404 hours.

Further, the improved epoxy molding compounds contain ≦0.8% antimony pentoxide. This is especially surprising in view of the prior art teaching that a higher percent antimony pentoxide (≧1%) will give formulation with better synergistic performance. One skilled in the art of molding compound systems would not be led to use about ≦0.8% antimony pentoxide because prior art teaches use of a halogen containing organic compound with ≧1% of pentoxide is expected to give reduced parametric failures.

In the present invention, the improved epoxy compound obtains superior results with either ≦1.0% or ≧1.0% bromine content. This result is unexpected based on the prior art teachings that high levels of antimony pentoxide are beneficial to high temperature reliability and high levels of bromine are detrimental. One skilled in the art would not be led to use about ≧1.0% bromine content with ≦0.8% antimony pentoxide because prior art teaches the use of ≧1.0% bromine content is expected to give poor dry heat reliability results.

The improved epoxy molding compounds gave superior results to compounds containing no basic aluminum carbonate hydrate and antimony trioxide when the voltage levels were monitored. In the high temperature storage life test performed at 175° C., Motorola SN 7420 devices were encapsulated in the epoxy molding compound. The compound containing DHT-4A showed no failure after 1342 hours at both 250 mV and 400 mV while the compound containing no DHT-4A showed at least 90% failure after 1342 hours at 250 mV and over 70% failure after 1342 hours at 400 mV.

The improved epoxy molding compound contains basic magnesium aluminum carbonate hydrate instead of other bismuth-containing materials (bismuth trioxide or IXE-600, a mixture of hydrated antimony pentoxide and basic nitrate, from Toagosei Chemical Industry Co., Ltd.). DHT-4A systems are superior to other bismuth-containing material systems in maintaining the electrical reliability of certain types of logic devices.

The present invention is not restricted to the above ingredients but may include other ingredients which do not detract from flame retardant properties of the flame retardant agent. Accordingly, other organic or inorganic materials may be added under the above conditions, including antimony trioxide and antimony tetraoxide in total amounts less than the amount of antimony pentoxide.

DESCRIPTION OF PREFERRED EMBODIMENTS

The following nonlimiting examples further illustrate the present invention relating to an improved epoxy molding compound, method and encapsulated device. All parts are by weight unless indicated otherwise.

EXAMPLES A-D

Epoxy encapsulants are prepared from the modified formulation A indicated in Table 2. The four groups of formulation differ in the presence/absence of antimony trioxide or antimony pentoxide and/or brominated resin of the following type:

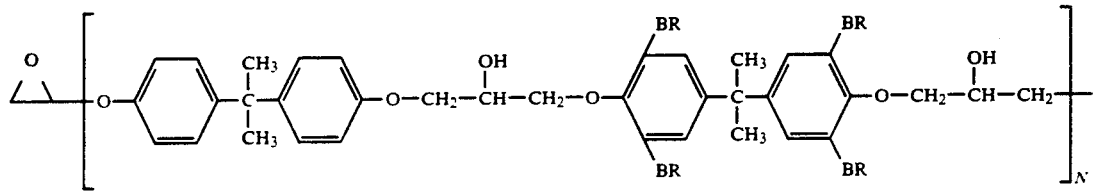

or brominated resin of the following type:

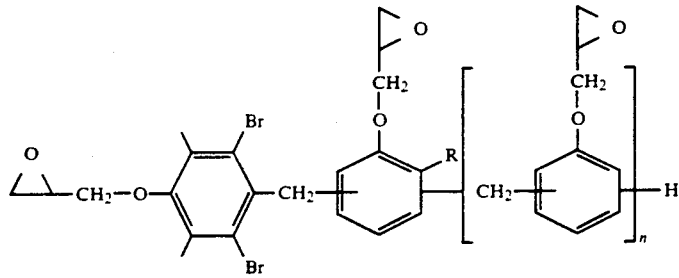

TABLE 2

| Description molding compound | A % | B % | C % | D % |
|---|---|---|---|---|
| Fused silica filler | 73.64 | 73.64 | 73.64 | 73.45 |
| Carbon black coloring | 0.23 | 0.23 | 0.23 | 0.23 |
| Phenol Novolac Hardener | 7.43 | 7.54 | 7.48 | 7.47 |
| Epoxy Cresol Novolac resin | 12.77 | 2.87 | 2.60 | 2.60 |
| Flexibilizers | 1.96 | 1.96 | 1.96 | 1.96 |
| Silane coupling agent | 0.70 | 0.70 | 0.70 | 0.70 |
| catalyst | 0.17 | 0.17 | 0.17 | 0.17 |
| wax lubricants | 0.50 | 0.50 | 0.50 | 0.50 |
| Brominated bis-A* type resin | 1.74 | — | — | — |
| Stable Bromine Cresol epoxy novolac (71482.OOL type) | — | 11.53* | — | — |
| Stable Bromine Cresol epoxy novolac (RO544-41091-21-1 type) | — | — | 11.86* | 11.86* |
| antimony trioxide | 0.86 | 0.86 | 0.86 | — |
| antimony pentoxide | — | — | — | 1.06 |

*Br Content = 0.85
All examples pass a UL94V-0 flammability rating at ⅛" bar.

EXAMPLES E-I

Five more samples are prepared with antimony pentoxide. The five groups of formulation differ in the presence/absence of basic magnesium aluminum carbonate hydrate and in the presence/absence of various bromine-containing organic compounds

TABLE 3

| | E | F | G | H | I |
|---|---|---|---|---|---|
| Fused silica filler | 75.21 | 73.82 | 75.21 | 75.18 | 75.18 |
| Carbon black coloring | 0.19 | 0.19 | 0.19 | 0.19 | 0.19 |
| Phenol Novolac hardener | 7.21 | 7.54 | 7.21 | 7.25 | 7.25 |
| Epoxy Cresol Novolac Resin | 12.06 | 2.87 | 12.53 | 13.23 | 4.06 |
| Flexibilizers | 1.00 | 1.96 | 1.00 | 1.00 | 1.00 |
| Silane coupling agent | 0.70 | 0.70 | 0.70 | 0.70 | 0.70 |
| Catalyst | 0.17 | 0.17 | 0.17 | 0.17 | 0.17 |
| Wax lubricants | 0.35 | 0.35 | 0.35 | 0.35 | 0.35 |
| Brominated epoxy resin (BREN TM) | 2.35* | — | 1.89** | — | — |
| Stable Bromine Cresol epoxy novolac (71842.OOL type) | — | 11.55*** | — | — | 10.33**** |
| Tetrabromo bisphenol-A | — | — | — | 1.18***** | — |
| Basic magnesium aluminum carbonate hydrate | 0.01 | — | — | — | 0.02 |

TABLE 3-continued

| | Examples | | | | |
|---|---|---|---|---|---|
| | E | F | G | H | I |
| Sb$_2$O$_5$ | 0.75 | 0.85 | 0.75 | 0.75 | 0.75 |

*% Br Content = 0.84
**% Br Content = 0.68
***% Br Content = 0.85
4*% Br Content = 0.76
5*% Br Content = 0.69
All examples pass a UL 94V-0 flammability rating at ⅛" bar.

EXAMPLE J

The four compounds as described in Examples A-D are subjected to a high temperature storage life test performed in dry conditions. The test results measuring parametric shifts in voltage output levels in which a failure was a voltage output level >500 mV at 24 mA, are summarized in Table 3. The test was performed in Examples A-D and on commercially available competitive molding compounds S-2, S-1 and N-1.

TABLE 4

HIGH TEMPERATURE STORAGE LIFE TEST (HTSL)
7400 Type TTL Devices

| | HTSL/175 C | | | | | HTSL/185 C | | | | | | |
|---|---|---|---|---|---|---|---|---|---|---|---|---|
| Molding Compound | 500 HRS | 596 HRS | 740 HRS | 884 HRS | 1238 HRS | 168 HRS | 238 HRS | 310 HRS | 382 HRS | 472 HRS | 640 HRS | 880 HRS |
| Competitive Cmpd. S-2 | 0/52 | 0/52 | 0/52 | 0/52 | 0/52 | 0/52 | 0/52 | 0/52 | 0/52 | 0/52 | 0/52 | 0/52 |
| Competitive Cmpd. S-1 | 0/43 | 0/43 | 0/43 | 0/43 | 0/43 | 0/42 | 0/42 | 0/42 | 0/42 | 0/42 | N/A+ | — |
| Competitive Cmpd. N-1 | 0/32 | 0/32 | 0/32 | 0/32 | 0/32 | 0/41 | 0/41 | 0/41 | 0/41 | 0/41 | 6/41 | 25/41 |
| Example | | | | | | | | | | | | |
| A | 1/53 | 1/53 | 1/53 | 1/53 | 11/53 | 0/53 | 0/53 | 0/53 | 1/53 | 4/53 | 46/53 | 53/53 |
| B | 5/55 | 5/55 | 6/55 | 6/55 | 7/55 | 2/55 | 2/55 | 7/55 | 8/55 | 9/55 | 17/55 | 47/55 |
| C | 2/54 | 2/54 | 3/54 | 7/54 | 9/54 | 2/55 | 5/55 | 5/55 | 5/55 | 5/55 | 8/55 | 21/55 |
| D | 0/48 | 0/48 | 0/48 | 0/48 | 0/48 | 0/48 | 0/48 | 0/48 | 0/48 | 0/48 | 0/48 | 0/48 |

| | HTSL/200 C | | | | | | | | | | | |
|---|---|---|---|---|---|---|---|---|---|---|---|---|
| Molding Compound | 92 HRS | 108 HRS | 124 HRS | 141 HRS | 158 HRS | 189 HRS | 205 HRS | 221 HRS | 254 HRS | 297 HRS | 362 HRS | 402 HRS |
| Competitive Cmpd. S-2 | 0/52 | 0/52 | 0/52 | 0/52 | 0/52 | 0/52 | 0/52 | 0/52 | 0/52 | 26/52 | 43/52 | 44/52 |
| Competitive Cmpd. S-1 | 0/42 | 5/42 | 14/42 | 37/42 | 41/42 | 42/42 | — | — | — | — | — | — |
| Competitive Cmpd. N-1 | 0/41 | 0/41 | 0/41 | 0/41 | 0/41 | 1/41 | 1/41 | 4/41 | 4/41 | 4/41 | 4/41 | 4/41 |
| Example | | | | | | | | | | | | |
| A | 1/53 | 18/53 | 40/53 | 53/53 | — | — | — | — | — | — | — | — |
| B | 2/53 | 4/53 | 4/53 | 6/53 | 6/53 | 34/53 | 34/53 | 40/53 | N/A* | — | — | — |
| C | 0/55 | 4/55 | 4/55 | 4/55 | 4/55 | 18/55 | 31/55 | 33/55 | 33/55 | 36/55 | 37/55 | 44/55 |
| D | 1/46 | 1/46 | 1/46 | 1/46 | 1/46 | 2/46 | 2/46 | 2/46 | 2/46 | 2/46 | 2/46 | 18/46 |

Parametric shifts in voltage output levels (VOL) were monitored.
A failure was VOL > 500 mV at 24 mA.

A review of the data shows that the antimony pentoxide sample (Example D) was far superior to the antimony trioxide samples (Examples A, B and C) in prolonging high temperature storage life. Example D was also far superior to the competitive compounds S-2, S-1 and N-1.

EXAMPLE K

The five compounds as described in Examples E-I are subjected to a high temperature storage life test under dry conditions along with competitive compounds S-2 and N-2. The test results measuring parametric shifts of voltage output levels in which a failure was a voltage output level >500 mV at 24 mA are summarized in Table 5.

TABLE 5

HIGH TEMPERATURE STORAGE TEST (HTS)
7400 Type TTL Device

| | HTS 200 C | | | | |
|---|---|---|---|---|---|
| Molding Compound | 96 HRS | 120 HRS | 168 HRS | 404 HRS | 478 HRS |
| Competitive Compound S-2 | 0/100 | 2/100 | 6/100 | 80/100 | 100/100 |
| Competitive Compound N-2 | 0/100 | 0/100 | 0/100 | 5/100 | 100/100 |
| Example | | | | | |
| E | | | 0/93 | 76/93 | 93/93 |
| F | 0/100 | 0/100 | 0/100 | 73/100 | 100/100 |
| G | 1/100 | 1/100 | 1/100 | 89/100 | 100/100 |
| H | 0/100 | 0/100 | 0/100 | 36/100 | 100/100 |
| I | 0/100 | 0/100 | 0/100 | 1/100 | 100/100 |

EXAMPLE L

The five compounds as described in Examples E-I are subjected to a high temperature storage test under dry conditions along with competitive compounds S-2 and N-2 following baking at 185° C. and 175° C. The results are summarized below.

TABLE 6

HIGH TEMPERATURE STORAGE (HTS) DATA FROM 185° C. & 175° C. BAKE

| HTS | | | | | | | | | | |
|---|---|---|---|---|---|---|---|---|---|---|
| 185 C | | | | | | | | | | |
| 638 | 974 | 1310 | 1500 | 1600 | 1700 | 1800 | 1900 | 2000 | 2150 | 2250 |

TABLE 6-continued

HIGH TEMPERATURE STORAGE (HTS) DATA FROM 185° C. & 175° C. BAKE

| Molding Compound | HRS | HRS | HRS | HRS | HRS | HRS | HRS | HRS | HRS | HRS | HRS |
|---|---|---|---|---|---|---|---|---|---|---|---|
| Competitive Cmpd. S-2 | 0/100 | 2/100 | 7/100 | 13/100 | 18/100 | 23/100 | 30/100 | 48/100 | 54/100 | 58/100 | 75/100 |
| Competitive Cmpd. N-2 | 0/100 | 0/100 | 3/100 | 15/100 | 17/100 | 23/100 | 24/100 | 26/100 | 26/100 | 29/100 | 29/100 |
| Example | | | | | | | | | | | |
| E | 0/100 | 0/100 | 6/100 | 44/100 | 94/100 | 100/100 | — | — | — | — | — |
| F | 0/100 | 0/100 | 4/100 | 23/100 | 87/100 | 100/100 | — | — | — | — | — |
| G | 0/100 | 0/100 | 20/100 | 54/100 | 83/100 | 96/100 | 100/100 | — | — | — | — |
| H | 0/100 | 2/100 | 81/100 | 91/100 | 96/100 | 97/100 | 98/100 | 100/100 | — | — | — |
| I | 0/100 | 0/100 | 0/100 | 0/100 | 0/100 | 1/100 | 3/100 | 16/100 | 25/100 | 25/100 | 69/100 |

| | HTS | | | | | | | |
|---|---|---|---|---|---|---|---|---|
| | 185 C | | 175 C | | | | | |
| Molding Compound | 2300 HRS | 2380 HRS | 500 HRS | 1031 HRS | 1500 HRS | 2000 HRS | 2500 HRS | 3000 HRS |
| Competitive Cmpd. S-2 | 87/100 | 90/100 | 1/100 | 4/100 | 7/100 | 8/100 | 8/100 | 8/100 |
| Competitive Cmpd. N-2 | 30/100 | 30/100 | 0/100 | 0/100 | 0/100 | 0/100 | 0/100 | 8/100 |
| Example | | | | | | | | |
| E | — | — | 0/100 | 0/100 | 0/100 | 0/100 | 0/100 | 2/100 |
| F | — | — | 1/100 | 1/100 | 1/100 | 1/100 | 1/100 | 1/100 |
| G | — | — | 0/100 | 0/100 | 0/100 | 0/100 | 0/100 | 0/100 |
| H | — | — | 0/100 | 0/100 | 1/100 | 1/100 | 1/100 | 1/100 |
| I | 91/100 | 96/100 | 0/100 | 0/100 | 0/100 | 0/100 | 0/100 | 0/100 |

A review of the test data enumerated in Table 5 and Table 6 show that only when the three ingredients (Stable Bromine cresol epoxy novolac, antimony pentoxide and basic magnesium aluminum carbonate hydrate) are used together are the best results obtained.

In particular, while high temperature storage tests performed at 175° C. show no substantial difference in parameteric shifts of voltage output levels, tests performed at 185° C. and 200° C. indicate that the devices molded with an epoxy molding compound having the stable bromine cresol epoxy novolac, antimony pentoxide and basic magnesium aluminum carbonate hydrate (Example I) exhibited superior storage life. Example I also proved to be far superior to competitive compounds S-2 and N-2.

EXAMPLE M

Example I underwent reliability tests wherein the devices were subjected to high temperatures (i.e. 85° C. to 125° C.) in both dry and wet environments while being continuously operated or biased. Additionally, the devices were cycled between −65° C. to +150° C. for up to 2000 cycles. No apparent device failures were noted in any of the tests.

It is believed that the superior performance of Example I is due both to the partial neutralization of the acidic character of antimony pentoxide and to reduced levels of halide ions by basic ion-exchange capable magnesium aluminum carbonate hydrate, thereby preventing undesireable corrosion of the device.

EXAMPLE N-O

Two more samples are prepared with brominated epoxy resin (BREN TM). The two formulations differ in the presence/absence of antimony trioxide or antimony pentoxide and in the presence/absence of basic magnesium aluminum carbonate hydrate (DHT-4A).

TABLE 8

| | Examples | |
|---|---|---|
| | N % | O % |
| Fused silica filler | 70.69 | 71.02 |
| Carbon black coloring | 0.20 | 0.20 |
| Phenol Novolac hardener | 9.42 | 9.18 |

TABLE 8-continued

| | Examples | |
|---|---|---|
| | N % | O % |
| Epoxy Cresol Novolac resin | 13.89 | 13.43 |
| Silane coupling agent | 0.70 | 0.70 |
| Catalyst | 0.35 | 0.35 |
| Wax lubricants | 0.45 | 0.44 |
| Brominated epoxy resin (BREN TM) | 3.80 | 3.80 |
| Antimony trioxide | 0.50 | — |
| Antimony pentoxide | — | 0.50 |
| Magnesium aluminum carbonate hydrate (DHT-4A) | — | 0.38 |

EXAMPLE P

The two compounds as described in Example N-O are subjected to a high temperature storage life test under dry conditions. The compounds were stored for a variable number of hours at 175° C. and the cumulative voltage output/low state level failures are recorded.

TABLE 9

HIGH TEMPERATURE STORAGE LIFE TEST (175° C.)
SN 7420 Devices
Cumulative VOL Failures
Voltage Failure Limits*

| | 250 mV | | 400 mV | |
|---|---|---|---|---|
| Hours | N | O | N | O |
| 0 | 0/39 | 0/37 | 0/39 | 0/37 |
| 88 | 0/39 | 0/37 | 0/39 | 0/37 |
| 176 | 0/39 | 0/37 | 0/39 | 0/37 |
| 198 | 0/39 | 0/37 | 0/39 | 0/37 |
| 352 | 0/39 | 0/37 | 0/39 | 0/37 |
| 506 | 0/39 | 0/37 | 0/39 | 0/37 |
| 638 | 15/39 | 0/37 | 1/39 | 0/37 |
| 814 | 35/39 | 0/37 | 14/39 | 0/37 |
| 968 | 37/39 | 0/37 | 23/39 | 0/37 |
| 1188 | 38/39 | 0/37 | 26/39 | 0/37 |
| 1342 | 38/39 | 0/37 | 30/39 | 0/37 |
| 1496 | 39/39 | 0/37 | 34/39 | 0/37 |
| 1650 | — | 0/37 | 36/39 | 0/37 |
| 1804 | — | 0/37 | 37/39 | 0/37 |
| 1958 | — | 0/37 | 38/39 | 0/37 |
| 2266 | — | 0/37 | — | 0/37 |
| 2596 | — | 0/37 | — | 0/37 |

TABLE 9-continued

HIGH TEMPERATURE STORAGE LIFE TEST (175° C.)
SN 7420 Devices
Cumulative VOL Failures
Voltage Failure Limits*

| Hours | 250 mV | | 400 mV | |
|---|---|---|---|---|
| | N | O | N | O |
| 3124 | — | 1/37 | — | 0/37 |

*Increased voltage output/low state levels (VOL) are reflective of increased resistance across the ball-bonds of these devices. 400 mV represents the device manufacturers maximum specification. A typical initial value is 200 mV.

A review of the data shows that the compound containing antimony pentoxide and DHT-4A yields superior results. In particular, after 638 hours VOL failures significantly increased for Example N than for Example O which contains the antimony pentoxide and the magnesium aluminum carbonate hydrate.

EXAMPLES Q-T

Four more samples are prepared. The four formulations all contain antimony pentoxide, but differ in the presence or absence of bromine-containing organic compounds (BREN TM or Dow Stable-Bromine 71842 Type), and in the absence/presence of basic metal oxide (bismuth trioxide or IXE-600) or magnesium oxide compound (DHT-4A).

TABLE 10

| | Examples | | | |
|---|---|---|---|---|
| | Q % | R % | S % | T % |
| Fused silica filler | 71.02 | 71.02 | 71.81 | 71.81 |
| Carbon black coloring | 0.20 | 0.20 | 0.20 | 0.20 |
| Phenol Novolac hardener | 9.18 | 9.18 | 9.18 | 9.18 |
| Epoxy Cresol Novolac resin | 13.43 | — | — | — |
| Silane coupling agent | 0.70 | 0.70 | 0.70 | 0.70 |
| Catalyst | 0.35 | 0.35 | 0.35 | 0.35 |
| Wax lubricants | 0.44 | 0.44 | 0.44 | 0.44 |
| Brominated epoxy resin (BREN TM)* | 3.80 | — | — | — |
| Brominated epoxy resin (Dow Stable-Br 71842 type)** | — | 16.44 | 16.44 | 16.44 |
| Antimony trioxide | — | — | — | — |
| Antimony pentoxide | 0.50 | 0.50 | 0.50 | — |
| DHT-4A | — | 0.38 | — | — |
| Bismuth trioxide | 0.38 | — | 0.38 | — |
| IXE-600 | — | — | — | 0.88 |

*contains 1.36 Br
**contains 1.22 Br

EXAMPLE U

The six compounds as described in examples N-O and Q-T are subjected to a high temperature storage life test the compounds were stored for a variable number of hours at 200° C. and the cumulative voltage output/low state level failures were recorded. The test results are summarized in Table 11.

TABLE 11

HIGH TEMPERATURE STORAGE LIFE TEST (200° C.)
SN 7420 Devices
Cumulative VOL Failures
Voltage Failure Limits

| | 250 mV | | | | | | 400 mV | | | | | |
|---|---|---|---|---|---|---|---|---|---|---|---|---|
| Hours | O | Q | R | S | T | N | O | Q | R | S | T | N |
| 0 | 0/37 | 0/37 | 0/36 | 0/36 | 0/33 | 0/32 | 0/37 | 0/37 | 0/36 | 0/36 | 0/33 | 0/32 |
| 88 | 0/37 | 0/37 | 0/36 | 8/36 | 30/33 | 4/32 | 0/37 | 0/37 | 0/36 | 0/36 | 0/33 | 0/32 |
| 176 | 1/37 | 15/37 | 0/36 | 14/36 | 32/33 | 8/32 | 0/37 | 8/37 | 0/36 | 1/36 | 4/33 | 1/32 |
| 264 | 5/37 | 17/37 | 0/36 | 19/36 | — | 13/32 | 0/37 | 8/37 | 0/36 | 1/36 | 12/33 | 1/32 |
| 418 | 10/37 | 37/37 | 0/36 | 27/36 | — | 22/32 | 1/37 | 22/37 | 0/36 | 12/36 | 19/33 | 15/32 |
| 572 | 12/37 | — | 2/36 | 31/36 | — | — | 3/37 | 32/37 | 0/36 | 29/36 | 22/33 | 26/32 |
| 748 | 21/37 | — | 4/36 | 31/36 | — | — | 5/37 | 36/37 | 0/36 | 32/36 | 25/33 | 29/32 |
| 880 | 35/37 | — | 12/36 | 31/36 | — | — | 10/37 | 37/37 | 0/36 | 34/36 | 29/33 | 31/32 |
| 1034 | 36/37 | — | 27/36 | — | — | — | 19/37 | — | 2/36 | 35/36 | 30/33 | 32/32 |
| 1188 | — | — | 36/36 | — | — | — | 21/37 | — | 17/36 | 36/36 | 32/33 | — |
| 1342 | — | — | — | — | — | — | 27/37 | — | 31/36 | — | 33/33 | — |

A review of the data shows that in prolonging the high temperature storage life of SN 7420 devices, devices having brominated epoxy resin (e.g. Dow Stable Br 71842 type) antimony pentoxide and magnesium aluminum carbonate hydrate are superior over those containing bismuth-containing materials. (Example R versus Examples S and T). Further, this combination provides superior performance in the high temperature storage life test compared to formulations containing the brominated epoxy resin BREN TM (Example R versus Example O and Q).

The foregoing examples are intended to illustrate without limitation, the improved flame retardant epoxy molding compound, method and encapsulated device. It is understood that changes and variation can be made therein without departing from the scope of the invention as defined in the following claims.

What is claimed is:

1. A method for encapsulating a semiconductor device, said method comprising the steps of:
   (1) heating a thermosetting epoxy molding compound to a liquid state, and
   (2) encapsulating a semiconductor device with said thermosetting epoxy molding compound heated to a liquid state, and
   (3) cooling said encapsulated semiconductor device wherein said epoxy molding comprises:
      (a) about 5-25 percent by weight of compound of an epoxy;
      (b) about 4-20 percent by weight of compound of a phenol-derived or a substituted phenol derived resin hardener;
      (c) an effective amount of a catalyst for the reaction between said epoxy resin and said hardener in an amount of from about 0.1 to 10% by weight of the combined weight of epoxy and hardener;
      (d) an effective amount of a mold release agent for the release of the cured molding compound from a mold in an amount of between about 0.01 and about 2 percent by weight of compound;
      (e) between about 50 and 85 percent by weight of compound of a filler; and (f) a flame retardant system of:
  (1) from about 0.40 to about 0.80% antimony pentoxide by weight of molding compound;
  (2) from about 0.01-1.0 percent sodium by weight of antimony pentoxide compound;
  (3) a reactive organic compound containing at least about 0.5% of bromine by weight of molding compound which may include one or more of the other components; and
  (4) from about 0.02 to about 4.0% magnesium aluminum carbonate hydrate by weight of molding compound.

2. The method of claim 1, wherein said epoxy is about 10-17 percent by weight of the epoxy molding compound.

3. The method of claim 1 wherein said hardener is a phenolic novolac.

4. The method of claim 1 wherein said hardener is an anhydride.

5. The method of claim 1 wherein said hardener is a polyanhydride of a maleic monomer and at least one alkyl styrene monomer or prepolymer of the polyanhydride and the epoxy resin.

6. The method of claim 1 wherein said epoxy molding compound comprises at least about 50 weight percent of an inorganic filler.

7. The method of claim 1 wherein said inorganic filler includes silica.

8. The method of claim 1 wherein said epoxy molding compound comprises between about 60 and about 80 weight percent silica.

9. The method of claim 1 wherein said epoxy molding compound includes a silane coupling agent.

10. The method according to claim 1 wherein said epoxy molding compound includes a colorant.

11. The method of claim 1 wherein said reactive bromine-containing organic compound is a bromophenol-formaldehyde novolac.

12. The method of claim 1 wherein said reactive bromine-containing organic compound is a polyglycidyl ether of bromophenol-formaldehyde novolac.

13. The method according to claim 1, wherein said reactive bromine-containing organic compound is a bromophenol epoxy novolac.

14. The method according to claim 1, wherein said reactive bromine-containing organic compound is a meta-brominated cresol epoxy novolac.

15. The method according to claim 1, wherein said bromine-containing organic compound is part of said epoxy.

16. The method according to claim 1, wherein said bromine-containing organic compound is part of said phenol-derived or substituted phenol-derived resin hardener.

17. The method according to claim 1, wherein said reactive organic compound containing about 0.5-5.4 percent of bromine by weight of the molding compound.

18. The method according to claim 1, wherein said reactive organic compound containing about 0.5-2.2 percent of bromine by weight of the molding compound.

19. The method according to claim 1, wherein said reactive organic compound containing about 0.5-1.8 percent of bromine by weight of the molding compound.

20. The method according to claim 1, wherein the said flame retardant system contains about 0.03-0.06 percent of sodium by weight of the antimony pentoxide.

21. The method according to claim 1, wherein the said flame retardant system contains about 0.02-3.20 percent of magnesium aluminum carbonate hydrate by weight of the molding compound.

22. The method of claim 1 wherein said semiconductor device is a treated silicon wafer.

23. The method of claim 1 wherein said semiconductor device is selected from the group consisting of transistors, diodes and integrated circuits.

* * * * *

UNITED STATES PATENT AND TRADEMARK OFFICE
CERTIFICATE OF CORRECTION

PATENT NO. : 5,104,604

DATED : April 14, 1992

INVENTOR(S) : Anthony A. Gallo

It is certified that error appears in the above-identified patent and that said Letters Patent is hereby corrected as shown below:

Title page should be deleted to appear as per attached title page.

Columns 1-16 should be deleted to appear as per attached columns 1-18.

Signed and Sealed this

Ninth Day of February, 1993

Attest:

STEPHEN G. KUNIN

*Attesting Officer*      *Acting Commissioner of Patents and Trademarks*

United States Patent [19]

Gallo

[11] Patent Number: 5,104,604

[45] Date of Patent: Apr. 14, 1992

[54] METHOD OF ENCAPSULATING A SEMICONDUCTOR DEVICE WITH A FLAME RETARDANT EPOXY MOLDING COMPOUND

[75] Inventor: Anthony A. Gallo, Olean, N.Y.

[73] Assignee: Dexter Electronic Materials Div. of Dexter Corp., N.Y.

[21] Appl. No.: 590,247

[22] Filed: Sep. 28, 1990

Related U.S. Application Data

[63] Continuation-in-part of Ser. No. 418,757, Oct. 5, 1989, Pat. No. 5,041,254, which is a continuation-in-part of Ser. No. 258,547, Oct. 17, 1988, abandoned.

[51] Int. Cl.$^5$ ............................................. B29C 45/14
[52] U.S. Cl. .................... 264/272.17; 264/331.12; 523/460
[58] Field of Search .............. 264/272.17, 272.13, 264/331.12; 523/460, 457

[56] References Cited

U.S. PATENT DOCUMENTS

| Re. 31,214 | 4/1983 | Petrow et al. | 524/411 |
| 2,879,257 | 3/1959 | Walter et al. | 260/45.9 |
| 3,856,890 | 12/1974 | Biddell | 260/897 |
| 3,860,523 | 1/1975 | Petrow et al. | 252/8.1 |
| 3,912,792 | 10/1975 | Touval | 260/863 |
| 3,915,926 | 10/1975 | Wambach | 260/40 |
| 3,920,459 | 11/1975 | Allen | 106/15 |
| 3,928,277 | 12/1975 | Wicker | 260/37 |
| 3,950,456 | 4/1976 | Newcombe | 260/830 |
| 3,983,185 | 10/1976 | Dorfman et al. | 260/863 |
| 4,006,114 | 2/1977 | Carlson | 260/28.5 |
| 4,024,318 | 5/1977 | Forster et al. | 428/519 |
| 4,075,154 | 2/1978 | Itoh et al. | 260/37 |
| 4,127,559 | 11/1978 | Newcombe | 260/47.75 |
| 4,137,212 | 1/1979 | Theyson et al. | 260/37 |
| 4,155,949 | 5/1979 | Kamiyama et al. | 260/857 |
| 4,205,142 | 5/1980 | Baer | 525/166 |
| 4,278,581 | 6/1981 | Nakazawa et al. | 260/29.6 |
| 4,282,136 | 8/1981 | Hunt et al. | 523/460 |
| 4,339,556 | 7/1982 | Baer | 523/220 |
| 4,417,018 | 11/1983 | Ogawa et al. | 524/261 |
| 4,544,688 | 10/1985 | Salensky et al. | 523/458 |
| 4,618,636 | 10/1986 | Muench et al. | 524/176 |
| 4,668,719 | 5/1987 | Kato et al. | 523/458 |
| 4,675,356 | 6/1987 | Miyata | 524/424 |
| 4,684,721 | 5/1987 | Wang et al. | 525/507 |
| 4,710,531 | 12/1987 | Dozzi et al. | 524/239 |
| 4,710,796 | 12/1987 | Ikeya et al. | 357/72 |
| 4,716,184 | 12/1987 | Kagawa | 523/460 |
| 4,725,638 | 2/1988 | Ellmann et al. | 524/377 |
| 4,743,044 | 5/1988 | Skipper et al. | 524/437 |

FOREIGN PATENT DOCUMENTS

| 123249 | 7/1982 | Japan | 523/457 |
| 143464 | 7/1986 | Japan | 523/460 |

Primary Examiner—James Lowe
Attorney, Agent, or Firm—Pennie & Edmonds

[57] ABSTRACT

A flame retardant epoxy molding compound comprises an epoxy, a hardener preferably of the novolac or anhydride type, a catalyst, a mold release agent, preferably a filler, preferably a colorant, preferably a coupling agent, an organic compound containing a higher percent of halogen (which can be part of the resin or the hardener), preferably the meta-brominated cresol epoxy novolac type, preferably containing at least about 0.5% of bromine by weight of the molding compound, a lower percent of sodium, preferably in the range of 0.03–0.06% by weight of the antimony peroxide, a lower percent of antimony pentoxide, preferably in the range of from less than about 0.8% by weight of the molding compound, and an amount of magnesium aluminum carbonate hydrate less than or about 4.0% by weight of the molding compound. The flame retardant epoxy compounds when used to encapsulate the semiconductor devices have improved high temperature stability and reliability compared to similar prior art molding compounds.

23 Claims, No Drawings

METHOD OF ENCAPSULATING A SEMICONDUCTOR DEVICE WITH A FLAME RETARDANT EPOXY MOLDING COMPOUND

This is a continuation-in-part of application Ser. No. 418,757, filed Oct. 5, 1989, now U.S. Pat. No. 5,041,25, which is in turn a continuation-in-part of application Ser. No. 07/258,547, filed Oct. 17, 1988, now abandoned.

BACKGROUND OF THE INVENTION

Technical Field

The present invention relates to an improved method of encapsulating a semiconductor device by heat curing an encapsulating compound comprising an epoxy, a hardener, a catalyst, a mold release agent, optionally a filler, optionally a colorant, optionally a coupling agent and a flame retardant system around a semiconductor device. In the improvement, the flame retardant system comprises a lower percentage of antimony pentoxide, a lower percentage of sodium and an organic compound containing a higher percentage of halogen than prior art molding compounds.

In the improvement, molding compounds with an organic compound containing a higher percentage of halogen along with a lower percentage of antimony pentoxide and sodium and with a basic magnesium oxide compound has unexpected superior high temperature stability and reliability.

The present invention also relates to improved flame retardant thermo setting epoxy molding compounds of the type comprising an epoxy, a hardener, a catalyst, a mold release agent, optionally a filler, optionally a colorant, optionally a coupling agent and a flame retardant system wherein the flame retardant system comprises a lower percentage of antimony pentoxide, a lower percentage of sodium, an organic compound containing a higher percentage of halogen than prior art molding compounds and optionally a basic magnesium oxide compound to reduce corrosion of metal conductor lines and pads of the semiconductor device.

The present invention also, includes an improved encapsulated semiconductor device wherein the encapsulant is as described above, with as flame-retardant system comprising a lower percentage of antimony pentoxide, and sodium, an organic compound containing a higher percentage of halogen than prior art molding compounds and optionally a basic magnesium oxide compound to reduce corrosion of metal conductor lines and pads of the semiconductor device.

In all three instances the halogen-containing organic compound may be a separate ingredient, but is preferably a part of either the epoxy or the hardener. The halogen containing organic compounds can also be halogen-containing compounds which become chemically incorporated into the product of the epoxy resin and the hardener upon setting or part of other ingredients such as the lubricant or the colorant.

The terms "epoxy molding compounds" as used herein means epoxy molding compound conventionally known in the art including any material containing two or more reactive oxirane groups. For example, the epoxy molding compound may have two or more epoxy groups in one molecule, including glycidyl ether type such as, phenol novolac type, cresol novolac type and the like; glycidyl-ester type; alicyclic type; heterocylic type and halogenated epoxy resins, etc. The epoxy resins may be used either singly or as a mixture of two or more resins.

Similarly, the term "epoxy novolac molding compound" as used herein includes any phenol-derived and substituted phenol derived novolac hardener conventionally used as hardener for epoxy resins. For example, phenolic novolacs, and cresolic novolacs, are most suitable. The epoxy novolac molding compounds may be used either singly or as a mixture of two or more compounds.

The term "catalyst" as used herein means a catalyst appropriate to the hardener used to promote the curing of the present composition. Such catalysts include basic and acidic catalysts such as the metal halide Lewis acids, e.g., boron trifluoride, stannic chloride, zinc chloride and the like, metal carboxylate-salts such as stannous octoate and the like; and amines, e.g., triethylamine, imidazole derivatives and the like. The catalysts are used in conventional amounts such as from about 0.1 to 5.0% by weight of the combined weight of epoxy and hardener.

The term "mold release agents" as used herein means chemical agents commonly used to assist the release of the cured epoxy molding compounds from the mold. For example, carnauba wax; montanic acid ester wax; polyethylene wax; polytetrafluoroethylene wax; glyceral monostearate; metallic stearates; paraffin waxes and the like are suitable.

The term "fillers" as used herein means one or more of the conventional fillers such as silica, calcium carbonate, calcium silicate, aluminum oxide, glass fibers, clay, and the like. The preferred filler is silica or a mixture of predominantly silica with other filler(s). The fillers usually are used in at least 50 percent by weight of the molding compound.

The term "colorant" as used herein includes colorant commonly used in epoxy molding compound, such as carbon black, pigments, dyes and the like.

The term "coupling agent," as used herein means a coupling agent known to improve dry electrical properties of the compound. The coupling agents may be of the silane type, characterized by the formula $R'Si(OR)_3$; where $R'$ represents an organo-functional group such as amino, mercapto, vinyl, epoxy or methacryloxy, and OR represents a hydrolyzable alkoxy group attached to the silicon. Preferred coupling agents are described in U.S. Pat Nos. 4,042,550 and 3,849,187, of which the descriptions are incorporated herein by reference.

The term "halogen-containing organic compound" or "organic compound containing halogen", as used herein, includes organic compound in which the halogen is present from any source including halogenation of a component or its precursor (such as a monomer) or by addition of halogen-containing monomers by reactions in which the halogen is not completely removed.

The halogen-containing organic compound used in a flame retardant system is preferably of the reactive type and further preferably has, as halogen, chlorine or bromine. Exemplary halogenated organic compounds are those types of polyglycidyl ether of bromophenol-formaldehyde novolac, commercially sold by Nippon Kayaku under the tradename "BREN ™," those described in U.S. Pat. Nos. 4,042,550 and 4,282,136, of which the descriptions are incorporated herein by reference and include halogenated bisphenol A and derivatives of bisphenol A such as tetrabromobisphenol A, and glycidyl ethers of halogenated resins such as the diglycidyl ether of tetrabromobisphenol A.

Preferred is meta-brominated cresol epoxy novolac available from the Dow Chemical Co. under the tradename "Stable Bromine Cresol Epoxy Novolac" (71842.00L type or 71970.00 type, production no. R0544-41091-21-1. These are described in U.S. Pat. Nos. 4,727,119 and 4,731,423). The 71842.00L type is of the general formula:

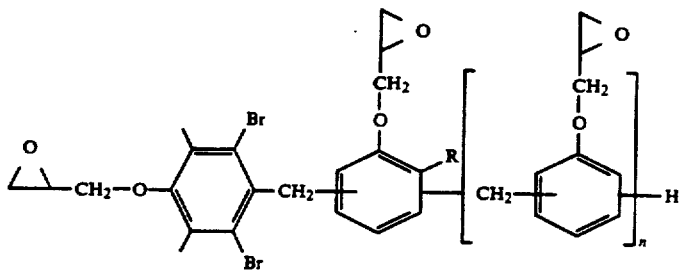

The 71970.00 type contains the following ingredients:

| | |
|---|---|
| Diglycidylether of Dibromotetramelthylbiphenol | 0-8% |
| Diglycidylether of Tribromotetramethylbiphenol Cas No. 108935-90-6 | 8-40% |
| Diglycidylether of Tetrabromotetramethylbiphenol Cas No. 72436-58-9 | 0-2% |
| Reaction product of cresol, formaldehyde & epichlorohydrin Cas No. 064425-89-4 | 60-90% |

The halogen containing organic compound may be a separate additive or may be contained in one or more of the organic components of the molding compound, especially the epoxy or the hardener, or possibly other components such as the lubricant, or the colorant or the filler (if organic).

Exemplary of reactive halogen-containing organic compounds which are part of the epoxy resin are meta-brominated phenolics such as meta-brominated cresol epoxy novolac.

The term "antimony pentoxide" as used herein means antimony pentoxide in any available form. Preferably, antimony pentoxide used is Nyacol A1590 commercially sold by the Nyacol Division of P.Q. Corporation which has a very low sodium content of 0.03 to 0.06% by weight of the antimony pentoxide as compared to that of 3 to 4% in prior art products such as Nyacol A1588LP.

The term "magnesium oxide compound" as used herein means any magnesium oxide in any available form capable of neutralizing the acidity of the antimony pentoxide and thereby reducing the corrosion of the metal semiconductor device lines and pads, especially in regions where two different metals are in contact with each other. Preferably, the magnesium oxide compound is magnesium aluminum carbonate hydrate commercially sold by Kyowa Chemical Industry Co. under the trade name "DHT-4A."

Description of Background Art

Epoxy resin compounds have often been used for encapsulation of semiconductor or device such as integrated circuits (IC), large scale integrated circuits (LSI), transistors and diodes, etc., or other electronic components. Such encapsulants generally comprise an epoxy, a hardener, a catalyst, a mold release agent, optionally a filler, optionally a colorant and sometimes a coupling agent.

Exemplary formulations of these ingredients are described in U.S. Pat. No. 4,710,796 to Ikeya et al., 4,282,136 to Hunt et al., U.S. Pat. No. 4,042,550 and references cited therein and in Raymond, T, Avoiding Bond Pad Failure Mechanisms in Au-Al Systems Semiconductor Int'l. p. 152-158, September 1989. Recently, the electronic industries require these epoxy molding compounds be flame retardant. Additives including halogenated compounds, transition metal oxides and hydrated alumina to improve the flame retardancy, as measured for example by Underwriters Laboratory Test 94V-0 of 1/16" bar have been reported. However, at high temperatures, these flame retardant additives detract from the compatibility of the encapsulated with semiconductor devices.

U.S. Pat. No. 4,710,796 to Ikeya et al. teaches a resin for encapsulating semiconductor device comprising an epoxy resin, curing agent, organic phosphine compound and at least one antimony oxide.

U.S. Pat. No. 4,042,550 teaches epoxyanhydride molding compounds with secondary fillers including antimony trioxide or antimony tetraoxide and halogenated compounds in flame retardant systems.

Similarly, U.S. Pat. No. 4,282,136 to Hunt et al. describes the use of synergistic flame retardants consisting of halogen-containing organic compounds and antimony pentoxide. The reference teaches that an encapsulant employing such a flame retardant system, when used to encapsulate a semiconductor device, has improved high temperature compatibility compared to similar molding compounds with antimony trioxide or antimony tetraoxide. However, the prior art epoxy molding compounds contains a high percent of sodium which is known to cause poor performance in semiconductor devices due to current leakage. See Moltzan et al., The Evolution of Epoxy Encapsulation Compounds For Integrated Circuits: A User's Perspective, Polymer for High Technology Electronics and Protronics, ACS Sym. Series No. 346, p.521, Sept. 7-12, 1986.

Raymond describes the necessity of IC manufacturers keeping Br in molding compounds at a low level (around 0.6-0.8%.) based on poor dry heat reliability results with a high Br compound (1.0%).

While the prior art flame retardant combinations provides reasonable flame retardance and satisfactory compatibility on electronic devices, a need clearly exists for flame retardant epoxy molding compounds of all types with improved compatibility, performance, cost and lower toxicity.

Accordingly, it is an object of the present invention to provide an improved flame retardant thermo setting epoxy molding compound.

It is yet another object of the present invention to provide an improved method of encapsulating a semiconductor device.

It is yet another object of the present invention to provide an improved encapsulated semiconductor device.

These and other objects of the invention, as well as a fuller understanding of the advantage thereof, can be had by reference to the following descriptions and claims.

SUMMARY OF THE INVENTION

The foregoing objects are achieved according to the present invention by an improved epoxy molding compound comprising:

(a) about 5-25 percent by weight of compound of an epoxy;

(b) about 4-20 percent by weight of compound of a phenol-derived or a substituted phenol derived resin hardener;

(c) an effective amount of a catalyst for the reaction between said epoxy resin and said hardener in an amount of from about 0.1 to 10% by weight of the combined weight of epoxy and hardener;

(d) an effective amount of a mold release agent for the release of the cured molding compound from a mold in an amount of between about 0.01 and about 2 percent by weight of composition;

(e) between about 50 and 85 percent by weight of composition of a filler; and (f) a flame retardant system of:
  (1) <about 0.8% antimony pentoxide by weight of molding compound;
  (2) from about 0.01-1% sodium by weight of antimony pentoxide; and
  (3) a reactive organic compound containing at least about 0.5% of bromine by weight of molding compound which may include one or more of the other components; and
  (4) ≦about 4.0% by weight of molding compound of a magnesium oxide compound which is most preferably magnesium aluminum carbonate hydrate.

Accordingly, Table 1 below summarizes the improved epoxy molding compounds.

TABLE 1

| Description Formulation (1): | Range (%) | Preferred Range (%) |
|---|---|---|
| Brominated epoxy resin | 5-25 | 10-17 |
| bromine content of molding compound (preferred reactive organic compound is Stable Bromide Cresol epoxy novolac) | at least about 0.5 | 1.0-1.8 |
| sodium (present in the antimony pentoxide) | 0.01-1 | 0.03-0.06 |
| antimony pentoxide | <0.80 | 0.40-0.80 |
| Magnesium aluminum carbonate hydrate | ≦4.0 | .02-3.20 |
| Carbon black colorant | 0.05-0.5 | 0.1-0.5 |
| Phenol Novolac Hardener | 4-20 | 4-12 |
| Fused Silica (SiO2) filler | 50-85 | 60-80 |
| silanes | 0.05-2.0 | 0.1-1.5 |
| catalysts | 0.01-10.0 | 0.5-2.0 |
| wax lubricants | 0.01-2 | 0.02-1.0 |

The improved epoxy molding compounds of the present invention are suitable for use in encapsulating a semiconductor device.

According to the present invention, the said improved epoxy molding compounds may be prepared by any conventional method. For example, the ingredients may be finely ground, dry blended and then densified on a hot differential roll mill, followed by granulation. Generally, the ingredients (or any portion of them) may be prepared as a fine powder, fed directly into a compounding device such as an extruder prepared as a premix of raw materials. If less than all of the ingredients are present in the initial form, the remainder of the ingredients can be added prior to or during densification.

Densification can be by mechanical compacting using a performer or a combining mill in the case of a fine powder, or by an extruder or differential roll mill in the case of the fine powders, direct feed or premix. Premixes or densified forms (such as preforms and granular forms), containing less than all of the ingredients can also be fed to the ultimate mold in the system with the remaining ingredients in a similar or different form.

The present invention includes flame retardant molding compounds in any physical form or even as systems of two or more components. Where two or more components are used, one should contain the epoxy, the other the hardener. Preferably, the catalyst is in the hardener component to avoid catalyzed homopolymerization of the epoxy.

In a preferred embodiment, in the laboratory, the dry ingredients of the formula are preground to a fine powder and then mixed in a large plastic bag. The liquid ingredients (i.e., the silane coupling agents) are added to dry ingredients and the mixture is mixed again by hand. The mixture is then treated on a large two-roll mill (one roll heated to about 90 C. and the other cooled with tap water) until a uniform sheet (about 6" wide by 24" long) is obtained. The sheet is allowed to cool and then ground to a fine powder.

In another preferred embodiment, in the pilot plant and during large scale production, the dry ingredients are mixed in a large hopper, the liquid ingredients are added in a homogeneous manner to ensure blending, and mixing continues. This mixture is then extruded (with heating) to give a continuous sheet which is cooled and grounded. The final ground powder can be used as is, or compacted (densified) in a preformer to give tablets (preforms) of desired shape and size.

These compounds may be molded into various articles by application of the appropriate temperature and pressure. For example, molding conditions for the encapsulated semiconductor of the present invention may range from about 300° to 400° F., (about 149°-204° C), preferably about 350° to about 375° F., (about 177°-191° C.), at 400 to 1,500 psi, (about 28 − 105 kg/cm$^2$), for a time ranging from about 30 to 120 seconds, preferably 60 to 90 seconds.

Any suitable molding apparatus may be employed, such as a transfer press equipped with a multi-cavity mold.

The ratio between the various ingredients may vary widely. In general, the epoxy will be in proportion to a novolac hardener so as to give a mole ratio of oxirane: reactive hydroxy between about 0.8 and 1.25. Similarly, the epoxy will be in proportion to an anhydride hardener so as to give a ratio of oxirane: anhydride equivalent between about 1.0 and 1.7, preferably between about 1.11 and 1.25.

The catalyst employed is generally applied at levels sufficient to harden the epoxy molding compound under anticipated molding conditions. Amounts between about 0.1 and 5 weight percent (by combined weight of epoxy and hardener) are sufficient.

The mold release agent will be employed in amounts sufficient to give good release from the mold and also to improve the dry electrical properties of the encapsulated semiconductor device. Amounts between about 0.01 and 2 percent by weight of total compound, preferably between about 0.02 and 1 percent by weight of total compound can be used.

The total amount of filler may range from 0 up to about 85 percent of the total compound. Preferably, the filler comprises a total of more than 50 weight percent of the total compound and more preferably between about 60 and about 85 weight percent of the total compound. Also, preferably, between about 60 and about 80 weight percent of the total compound is a silica filler.

Colorants, if employed, are generally in amounts sufficient to give encapsulated devices the desired color preferably black. Amounts between about 0.1–0.5% by weight of total compound can be employed.

Coupling agents, and in particular silane coupling agents, are provided in amounts sufficient to give the desired dry electrical properties and preferably between about 0.05 and 2 weight percent by total weight of compound, more preferably between about 0.1 and 1.5 weight percent by total weight of compound.

The epoxy molding compound obtained may be used to encapsulate semiconductor devices by any conventional method. For example, the preferred improved epoxy molding formulations comprising 0.4–0.8% percentage of antimony pentoxide; 0.03–0.06% sodium content (by weight of antimony pentoxide) and an organic compound containing about 1.0–1.8% . of bromine when molded on test devices have unexpected superior high temperature stability and reliability compared to prior art formulations as disclosed in U.S. Pat. No. 4,282.136 to Hunt et al.

The use of a lower percentage of antimony pentoxide in the present invention is preferred because antimony pentoxide is expensive and toxic.

Improved epoxy molding formulations comprising 0.4–0.8 percent of antimony pentoxide, 0.03–0.06 percent of sodium (by weight of antimony pentoxide) and an organic compound containing about 1.0–1.8 percent of bromine in high temperature storage life tests produce superior test results. The high temperature storage life test is routinely performed by semiconductor manufacturers to assess electrical reliability of the devices. In the high temperature storage life test, parametric shifts in voltage output levels are monitored. The temperature at which the semiconductor is stored may be varied. The voltage output levels reflect increased resistance across the ball-bonds of the devices.

The improved epoxy molding formulations are uniquely effective in delaying or eliminating the failure due to parameter shifts in voltage output levels of previous semiconductor devices. In the high temperature storage life test, Motorola SN 7420 devices were encapsulated in the improved epoxy molding compound. The improved epoxy molding compound shows no failure (greater than or equal to 400 mV at a constant 16 mA current) at 200° C. out to 880 hours and no failure (greater than or equal to 250 mV at a constant 16 mA current) at 200° C. out to 418 hours while comparable samples with BREN ™ with or without DHT-4A shows at least 27% failure (greater than or equal to 400 mV and a constant 16 mA current) at 200° C. in 880 hours and at least 27% failure (greater than or equal to 250 mV at constant 16 mA current) at 200° C. in 418 hours.

Further, the improved epoxy molding compounds gave superior high temperature storage life test results than other combination containing BREN ™ with or without DHT-4A when the temperature at which the semiconductors stored was varied at a constant voltage output level. In the high temperature storage life test, Advanced Micro Devices, Inc. 7400 Type TTL devices were encapsulated in the improved epoxy molding compound. At 185° C., the improved epoxy molding shows only 3% failure after 1800 hours while comparable samples with BREN ™ with or without DHT-4A shows at least 98% failure after 1800 hours. At 200° C., the improved epoxy molding shows only 1% failure after 404 hours while comparable samples with BREN ™ with or without DHT-4A show at least 76% failure after 404 hours.

Further, the improved epoxy molding compounds contain ≦0.8% antimony pentoxide. This is especially surprising in view of the prior art teaching that a higher percent antimony pentoxide (≧1%) will give formulation with better synergistic performance. One skilled in the art of molding compound systems would not be led to use about ≦0.8% antimony pentoxide because prior art teaches use of a halogen containing organic compound with ≧1% of pentoxide is expected to give reduced parametric failures.

In the present invention, the improved epoxy compound obtains superior results with either ≦1.0% or ≧1.0% bromine content. This result is unexpected based on the prior art teachings that high levels of antimony pentoxide are beneficial to high temperature reliability and high levels of bromine are detrimental. One skilled in the art would not be led to use about ≧1.0% bromine content with ≦0.8% antimony pentoxide because prior art teaches the use of ≧1.0% bromine content is expected to give poor dry heat reliability results.

The improved epoxy molding compounds gave superior results to compounds containing no basic aluminum carbonate hydrate and antimony trioxide when the voltage levels were monitored. In the high temperature storage life test performed at 175° C., Motorola SN 7420 devices were encapsulated in the epoxy molding compound. The compound containing DHT-4A showed no failure after 1342 hours at both 250 mV and 400 mV while the compound containing no DHT-4A showed at least 90% failure after 1342 hours at 250 mV and over 70% failure after 1342 hours at 400 mV.

The improved epoxy molding compound contains basic magnesium aluminum carbonate hydrate instead of other bismuth-containing materials (bismuth trioxide or IXE-600, a mixture of hydrated antimony pentoxide and basic nitrate, from Toagosei Chemical Industry Co., Ltd.). DHT-4A systems are superior to other bismuth-containing material systems in maintaining the electrical reliability of certain types of logic devices.

The present invention is not restricted to the above ingredients but may include other ingredients which do not detract from flame retardant properties of the flame retardant agent. Accordingly, other organic or inorganic materials may be added under the above conditions, including antimony trioxide and antimony tetraoxide in total amounts less than the amount of antimony pentoxide.

DESCRIPTION OF PREFERRED EMBODIMENTS

The following nonlimiting examples further illustrate the present invention relating to an improved epoxy molding compound, method and encapsulated device. All parts are by weight unless indicated otherwise.

EXAMPLES A-D

Epoxy encapsulants are prepared from the modified formulation A indicated in Table 2. The four groups of

TABLE 2

| Description molding compound | Examples | | | |
|---|---|---|---|---|
| | A % | B % | C % | D % |
| Fused silica filler | 73.64 | 73.64 | 73.64 | 73.45 |
| Carbon black coloring | 0.23 | 0.23 | 0.23 | 0.23 |
| Phenol Novolac Hardener | 7.43 | 7.54 | 7.48 | 7.47 |
| Epoxy Cresol Novolac resin | 12.77 | 2.87 | 2.60 | 2.60 |
| Flexibilizers | 1.96 | 1.96 | 1.96 | 1.96 |
| Silane coupling agent | 0.70 | 0.70 | 0.70 | 0.70 |
| catalyst | 0.17 | 0.17 | 0.17 | 0.17 |
| wax lubricants | 0.50 | 0.50 | 0.50 | 0.50 |
| Brominated bis-A* type resin | 1.74 | — | — | — |
| Stable Bromine Cresol epoxy novolac (71482.OOL type) | — | 11.53* | — | — |
| Stable Bromine Cresol epoxy novolac (RO544-41091-21-1 type) | — | — | 11.86* | 11.86* |
| antimony trioxide | 0.86 | 0.86 | 0.86 | — |
| antimony pentoxide | — | — | — | 1.06 |

*Br Content = 0.85
All examples pass a UL94V-0 flammability rating at ⅛" bar.

formulation differ in the presence/absence of antimony trioxide or antimony pentoxide and/or brominated resin of the following type:

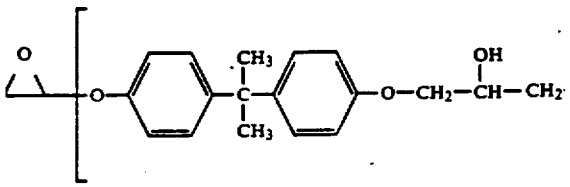

or brominated resin of the following type:

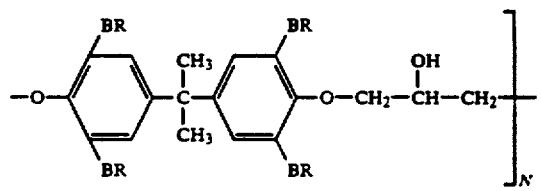

EXAMPLES E-I

Five more samples are prepared with antimony pentoxide. The five groups of formulation differ in the presence/absence of basic magnesium aluminum carbonate hydrate and in the presence/absence of various bromine-containing organic compounds

TABLE 3

| | Examples | | | | |
|---|---|---|---|---|---|
| | E | F | G | H | I |
| Fused silica filler | 75.21 | 73.82 | 75.21 | 75.18 | 75.18 |
| Carbon black coloring | 0.19 | 0.19 | 0.19 | 0.19 | 0.19 |
| Phenol Novolac hardener | 7.21 | 7.54 | 7.21 | 7.25 | 7.25 |
| Epoxy Cresol Novolac Resin | 12.06 | 2.87 | 12.53 | 13.23 | 4.06 |
| Flexibilizers | 1.00 | 1.96 | 1.00 | 1.00 | 1.00 |
| Silane coupling agent | 0.70 | 0.70 | 0.70 | 0.70 | 0.70 |
| Catalyst | 0.17 | 0.17 | 0.17 | 0.17 | 0.17 |
| Wax lubricants | 0.35 | 0.35 | 0.35 | 0.35 | 0.35 |
| Brominated epoxy resin (BREN ™) | 2.35* | — | 1.89** | — | — |
| Stable Bromine Cresol epoxy novolac (718842.OOL type) | — | 11.55*** | — | — | 10.33⁴* |
| Tetrabromo bisphenol-A | — | — | — | 1.18⁵* | — |
| Basic magnesium aluminum carbonate hydrate | 0.01 | — | — | — | 0.02 |
| $Sb_2O_5$ | 0.75 | 0.85 | 0.75 | 0.75 | 0.75 |

*% Br Content = 0.84
**% Br Content = 0.68
***% Br Content = 0.85
⁴*% Br Content = 0.76
⁵*% Br Content = 0.69
All examples pass a UL 94V-0 flammability rating at ⅛" bar.

EXAMPLE J

The four compounds as described in Examples A-D are subjected to a high temperature storage life test performed in dry conditions. The test results measuring parametric shifts in voltage output levels in which a failure was a voltage output level >500 mV at 24 mA, are summarized in Table 3. The test was performed in Examples A-D and on commercially available competitive molding compounds S-2, S-1 and N-1.

A review of the data shows that the antimony pentoxide sample (Example D) was far superior to the antimony trioxide samples (Examples A, B and C) in prolonging high temperature storage life. Example D was also far superior to the competitive compounds S-2, S-1 and N-1.

TABLE 5

HIGH TEMPERATURE STORAGE TEST (HTS)
7400 Type TTL Device

| Molding Compound | HTS 200 C | | | | |
|---|---|---|---|---|---|
| | 96 HRS | 120 HRS | 168 HRS | 404 HRS | 478 HRS |
| Competitive Compound S-2 | 0/100 | 2/100 | 6/100 | 80/100 | 100/100 |
| Competitive Compound N-2 | 0/100 | 0/100 | 0/100 | 5/100 | 100/100 |
| Example | | | | | |
| E | | | 0/93 | 76/93 | 93/93 |
| F | 0/100 | 0/100 | 0/100 | 73/100 | 100/100 |
| G | 1/100 | 1/100 | 1/100 | 89/100 | 100/100 |
| H | 0/100 | 0/100 | 0/100 | 36/100 | 100/100 |
| I | 0/100 | 0/100 | 0/100 | 1/100 | 100/100 |

TABLE 4

HIGH TEMPERATURE STORAGE LIFE TEST (HTSL)
7400 Type TTL Devices

| | HTSL/175 C | | | | | HTSL/185 C | | | | | | |
|---|---|---|---|---|---|---|---|---|---|---|---|---|
| Molding Compound | 500 HRS | 596 HRS | 740 HRS | 884 HRS | 1238 HRS | 168 HRS | 238 HRS | 310 HRS | 382 HRS | 472 HRS | 640 HRS | 880 HRS |
| Competitive Cmpd. S-2 | 0/52 | 0/52 | 0/52 | 0/52 | 0/52 | 0/52 | 0/52 | 0/52 | 0/52 | 0/52 | 0/52 | 0/52 |
| Competitive Cmpd. S-1 | 0/43 | 0/43 | 0/43 | 0/43 | 0/43 | 0/42 | 0/42 | 0/42 | 0/42 | 0/42 | N/A+ | — |
| Competitive Cmpd. N-1 | 0/32 | 0/32 | 0/32 | 0/32 | 0/32 | 0/41 | 0/41 | 0/41 | 0/41 | 0/41 | 6/41 | 25/41 |
| Example | | | | | | | | | | | | |
| A | 1/53 | 1/53 | 1/53 | 1/53 | 11/53 | 0/53 | 0/53 | 0/53 | 1/53 | 4/53 | 46/53 | 53/53 |
| B | 5/55 | 5/55 | 6/55 | 6/55 | 7/55 | 2/55 | 2/55 | 7/55 | 8/55 | 9/55 | 17/55 | 47/55 |
| C | 2/54 | 2/54 | 3/54 | 7/54 | 9/54 | 2/55 | 5/55 | 5/55 | 5/55 | 5/55 | 8/55 | 21/55 |
| D | 0/48 | 0/48 | 0/48 | 0/48 | 0/48 | 0/48 | 0/48 | 0/48 | 0/48 | 0/48 | 0/48 | 0/48 |

| | HTSL/200 C | | | | | | | | | | |
|---|---|---|---|---|---|---|---|---|---|---|---|
| Molding Compound | 92 HRS | 108 HRS | 124 HRS | 141 HRS | 158 HRS | 189 HRS | 205 HRS | 221 HRS | 254 HRS | 297 HRS | 362 HRS | 402 HRS |
| Competitive Cmpd. S-2 | 0/52 | 0/52 | 0/52 | 0/52 | 0/52 | 0/52 | 0/52 | 0/52 | 0/52 | 26/52 | 43/52 | 44/52 |
| Competitive Cmpd. S-1 | 0/42 | 5/42 | 14/42 | 37/42 | 41/42 | 42/42 | — | — | — | — | — | — |
| Competitive Cmpd. N-1 | 0/41 | 0/41 | 0/41 | 0/41 | 0/41 | 1/41 | 1/41 | 4/41 | 4/41 | 4/41 | 4/41 | 4/41 |
| Example | | | | | | | | | | | | |
| A | 1/53 | 18/53 | 40/53 | 53/53 | — | — | — | — | — | — | — | — |
| B | 2/53 | 4/53 | 4/53 | 6/53 | 6/53 | 34/53 | 34/53 | 40/53 | N/A* | — | — | — |
| C | 0/55 | 4/55 | 4/55 | 4/55 | 4/55 | 18/55 | 31/55 | 33/55 | 33/55 | 36/55 | 37/55 | 44/55 |
| D | 1/46 | 1/46 | 1/46 | 1/46 | 1/46 | 2/46 | 2/46 | 2/46 | 2/46 | 2/46 | 2/46 | 18/46 |

Parametric shifts in voltage output levels (VOL) were monitored.
A failure was VOL > 500 mV at 24 mA.

EXAMPLE K

The five compounds as described in Examples E-I are subjected to a high temperature storage life test under dry conditions along with competitive compounds S-2 and N-2. The test results measuring parametric shifts of voltage output levels in which a failure was a voltage output level >500 mV at 24 mA are summarized in Table 5.

EXAMPLE L

The five compounds as described in Examples E-I are subjected to a high temperature storage test under dry conditions along with competitive compounds S-2 and N-2 following baking at 185° C. and 175° C. The results are summarized below.

TABLE 6

HIGH TEMPERATURE STORAGE (HTS) DATA FROM 185° C. & 175° C. BAKE

| | HTS | | | | | | | | | | |
|---|---|---|---|---|---|---|---|---|---|---|---|
| | 185 C | | | | | | | | | | |
| Molding Compound | 638 HRS | 974 HRS | 1310 HRS | 1500 HRS | 1600 HRS | 1700 HRS | 1800 HRS | 1900 HRS | 2000 HRS | 2150 HRS | 2250 HRS |
| Competitive Cmpd. S-2 | 0/100 | 2/100 | 7/100 | 13/100 | 18/100 | 23/100 | 30/100 | 48/100 | 54/100 | 58/100 | 75/100 |
| Competitive Cmpd. N-2 | 0/100 | 0/100 | 3/100 | 15/100 | 17/100 | 23/100 | 24/100 | 26/100 | 26/100 | 29/100 | 29/100 |
| Example | | | | | | | | | | | |
| E | 0/100 | 0/100 | 6/100 | 44/100 | 94/100 | 100/100 | — | — | — | — | — |
| F | 0/100 | 0/100 | 4/100 | 23/100 | 87/100 | 100/100 | — | — | — | — | — |
| G | 0/100 | 0/100 | 20/100 | 54/100 | 83/100 | 96/100 | 100/100 | — | — | — | — |
| H | 0/100 | 2/100 | 81/100 | 91/100 | 96/100 | 97/100 | 98/100 | 100/100 | — | — | — |
| I | 0/100 | 0/100 | 0/100 | 0/100 | 0/100 | 1/100 | 3/100 | 16/100 | 25/100 | 25/100 | 69/100 |

| | HTS | | | | | | | |
|---|---|---|---|---|---|---|---|---|
| | 185 C | | 175 C | | | | | |
| Molding Compound | 2300 HRS | 2380 HRS | 500 HRS | 1031 HRS | 1500 HRS | 2000 HRS | 2500 HRS | 3000 HRS |
| Competitive Cmpd. S-2 | 87/100 | 90/100 | 1/100 | 4/100 | 7/100 | 8/100 | 8/100 | 8/100 |
| Competitive Cmpd. N-2 | 30/100 | 30/100 | 0/100 | 0/100 | 0/100 | 0/100 | 0/100 | 8/100 |
| Example | | | | | | | | |
| E | — | — | 0/100 | 0/100 | 0/100 | 0/100 | 0/100 | 2/100 |
| F | — | — | 1/100 | 1/100 | 1/100 | 1/100 | 1/100 | 1/100 |
| G | — | — | 0/100 | 0/100 | 0/100 | 0/100 | 0/100 | 0/100 |
| H | — | — | 0/100 | 0/100 | 1/100 | 1/100 | 1/100 | 1/100 |
| I | 91/100 | 96/100 | 0/100 | 0/100 | 0/100 | 0/100 | 0/100 | 0/100 |

A review of the test data enumerated in Table 5 and Table 6 show that only when the three ingredients (Stable Bromine cresol epoxy novolac, antimony pentoxide and basic magnesium aluminum carbonate hydrate) are used together are the best results obtained.

In particular, while high temperature storage tests performed at 175° C. show no substantial difference in parametric shifts of voltage output levels, tests performed at 185° C. and 200° C. indicate that the devices molded with an epoxy molding compound having the stable bromine cresol epoxy novolac, antimony pentoxide and basic magnesium aluminum carbonate hydrate (Example I) exhibited superior storage life. Example I also proved to be far superior to competitive compounds S-2 and N-2.

EXAMPLE M

Example I underwent reliability tests wherein the devices were subjected to high temperatures (i.e. 85° C. to 125° C.) in both dry and wet environments while being continuously operated or biased. Additionally, the devices were cycled between −65° C. to +150° C. for up to 2000 cycles. No apparent device failures were noted in any of the tests.

It is believed that the superior performance of Example I is due both to the partial neutralization of the acidic character of antimony pentoxide and to reduced levels of halide ions by basic ion-exchange capable magnesium aluminum carbonate hydrate, thereby preventing undesireable corrosion of the device.

EXAMPLE N-O

Two more samples are prepared with brominated epoxy resin (BREN TM). The two formulations differ in the presence/absence of antimony trioxide or antimony pentoxide and in the presence/absence of basic magnesium aluminum carbonate hydrate (DHT-4A).

TABLE 8

|  | Examples | |
|---|---|---|
|  | N % | O % |
| Fused silica filler | 70.69 | 71.02 |
| Carbon black coloring | 0.20 | 0.20 |
| Phenol Novolac hardener | 9.42 | 9.18 |
| Epoxy Cresol Novolac resin | 13.89 | 13.43 |
| Silane coupling agent | 0.70 | 0.70 |
| Catalyst | 0.35 | 0.35 |
| Wax lubricants | 0.45 | 0.44 |
| Brominated epoxy resin (BREN TM) | 3.80 | 3.80 |
| Antimony trioxide | 0.50 | — |
| Antimony pentoxide | — | 0.50 |
| Magnesium aluminum carbonate hydrate (DHT-4A) | — | 0.38 |

EXAMPLE P

The two compounds as described in Example N-O are subjected to a high temperature storage life test under dry conditions. The compounds were stored for a variable number of hours at 175° C. and the cumulative voltage output/low state level failures are recorded.

TABLE 9

HIGH TEMPERATURE STORAGE LIFE TEST (175° C.)
SN 7420 Devices
Cumulative VOL Failures
Voltage Failure Limits*

|  | 250 mV | | 400 mV | |
|---|---|---|---|---|
| Hours | N | O | N | O |
| 0 | 0/39 | 0/37 | 0/39 | 0/37 |
| 88 | 0/39 | 0/37 | 0/39 | 0/37 |
| 176 | 0/39 | 0/37 | 0/39 | 0/37 |
| 198 | 0/39 | 0/37 | 0/39 | 0/37 |
| 352 | 0/39 | 0/37 | 0/39 | 0/37 |
| 506 | 0/39 | 0/37 | 0/39 | 0/37 |
| 638 | 15/39 | 0/37 | 1/39 | 0/37 |
| 814 | 35/39 | 0/37 | 14/39 | 0/37 |
| 968 | 37/39 | 0/37 | 23/39 | 0/37 |
| 1188 | 38/39 | 0/37 | 26/39 | 0/37 |
| 1342 | 38/39 | 0/37 | 30/39 | 0/37 |
| 1496 | 39/39 | 0/37 | 34/39 | 0/37 |
| 1650 | — | 0/37 | 36/39 | 0/37 |
| 1804 | — | 0/37 | 37/39 | 0/37 |
| 1958 | — | 0/37 | 38/39 | 0/37 |
| 2266 | — | 0/37 | — | 0/37 |
| 2596 | — | 0/37 | — | 0/37 |
| 3124 | — | 1/37 | — | 0/37 |

*Increased voltage output/low state levels (VOL) are reflective of increased resistance across the ball-bonds of these devices. 400 mV represents the device manufacturers maximum specification. A typical initial value is 200 mV.

A review of the data shows that the compound containing antimony pentoxide and DHT-4A yields superior results. In particular, after 638 hours VOL failures significantly increased for Example N than for Example 0 which contains the antimony pentoxide and the magnesium aluminum carbonate hydrate.

EXAMPLES Q-T

Four more samples are prepared. The four formulations all contain antimony pentoxide, but differ in the presence or absence of bromine-containing organic compounds (BREN TM or Dow Stable-Bromine 71842 Type), and in the absence/presence of basic metal oxide (bismuth trioxide or IXE-600) or magnesium oxide compound (DHT-4A).

TABLE 10

|  | Examples | | | |
|---|---|---|---|---|
|  | Q % | R % | S % | T % |
| Fused silica filler | 71.02 | 71.02 | 71.81 | 71.81 |
| Carbon black coloring | 0.20 | 0.20 | 0.20 | 0.20 |
| Phenol Novolac hardener | 9.18 | 9.18 | 9.18 | 9.18 |
| Epoxy Cresol Novolac resin | 13.43 | — | — | — |
| Silane coupling agent | 0.70 | 0.70 | 0.70 | 0.70 |
| Catalyst | 0.35 | 0.35 | 0.35 | 0.35 |
| Wax lubricants | 0.44 | 0.44 | 0.44 | 0.44 |
| Brominated epoxy resin (BREN TM)* | 3.80 | — | — | — |
| Brominated epoxy resin (Dow Stable-Br 71842 type)** | — | 16.44 | 16.44 | 16.44 |
| Antimony trioxide | — | — | — | — |
| Antimony pentoxide | 0.50 | 0.50 | 0.50 | — |
| DHT-4A | — | 0.38 | — | — |
| Bismuth trioxide | 0.38 | — | 0.38 | — |
| IXE-600 | — | — | — | 0.88 |

*contains 1.36 Br
**contains 1.22 Br

EXAMPLE U

The six compounds as described in examples N-O and Q-T are subjected to a high temperature storage life test the compounds were stored for a variable number of hours at 200° C. and the cumulative voltage output/low state level failures were recorded. The test results are summarized in Table 11.

TABLE 11

HIGH TEMPERATURE STORAGE LIFE TEST (200° C.)
SN 7420 Devices
Cumulative VOL Failures
Voltage Failure Limits

| Hours | 250 mV | | | | | | 400 mV | | | | | |
|---|---|---|---|---|---|---|---|---|---|---|---|---|
| | O | Q | R | S | T | N | O | Q | R | S | T | N |
| 0 | 0/37 | 0/37 | 0/36 | 0/36 | 0/33 | 0/32 | 0/37 | 0/37 | 0/36 | 0/36 | 0/33 | 0/32 |
| 88 | 0/37 | 0/37 | 0/36 | 8/36 | 30/33 | 4/32 | 0/37 | 0/37 | 0/36 | 0/36 | 0/33 | 0/32 |
| 176 | 1/37 | 15/37 | 0/36 | 14/36 | 32/33 | 8/32 | 0/37 | 8/37 | 0/36 | 1/36 | 4/33 | 1/32 |
| 264 | 5/37 | 17/37 | 0/36 | 19/36 | — | 13/32 | 0/37 | 8/37 | 0/36 | 1/36 | 12/33 | 1/32 |
| 418 | 10/37 | 37/37 | 0/36 | 27/36 | — | 22/32 | 1/37 | 22/37 | 0/36 | 12/36 | 19/33 | 15/32 |
| 572 | 12/37 | — | 2/36 | 31/36 | — | — | 3/37 | 32/37 | 0/36 | 29/36 | 22/33 | 26/32 |
| 748 | 21/37 | — | 4/36 | 31/36 | — | — | 5/37 | 36/37 | 0/36 | 32/36 | 25/33 | 29/32 |
| 880 | 35/37 | — | 12/36 | 31/36 | — | — | 10/37 | 37/37 | 0/36 | 34/36 | 29/33 | 31/32 |
| 1034 | 36/37 | — | 27/36 | — | — | — | 19/37 | — | 2/36 | 35/36 | 30/33 | 32/32 |
| 1188 | — | — | 36/36 | — | — | — | 21/37 | — | 17/36 | 36/36 | 32/33 | — |
| 1342 | — | — | — | — | — | — | 27/37 | — | 31/36 | — | 33/33 | — |

A review of the data shows that in prolonging the high temperature storage life of SN 7420 devices, devices having brominated epoxy resin (e.g. Dow Stable Br 71842 type) antimony pentoxide and magnesium aluminum carbonate hydrate are superior over those containing bismuth-containing materials. (Example R versus Examples S and T). Further, this combination provides superior performance in the high temperature storage life test compared to formulations containing the brominated epoxy resin BREN ™ (Example R versus Example O and Q).

The foregoing examples are intended to illustrate without limitation, the improved flame retardant epoxy molding compound, method and encapsulated device. It is understood that changes and variation can be made therein without departing from the scope of the invention as defined in the following claims.

What is claimed is:

1. A method for encapsulating a semiconductor device, said method comprising the steps of:
   (1) heating a thermosetting epoxy molding compound to a liquid state, and
   (2) encapsulating a semiconductor device with said thermosetting epoxy molding compound heated to a liquid state, and
   (3) cooling said encapsulated semiconductor device wherein said epoxy molding comprises:
      (a) about 5-25 percent by weight of compound of an epoxy;
      (b) about 4-20 percent by weight of compound of a phenol-derived or a substituted phenol derived resin hardener;
      (c) an effective amount of a catalyst for the reaction between said epoxy resin and said hardener in an amount of from about 0.1 to 10% by weight of the combined weight of epoxy and hardener;
      (d) an effective amount of a mold release agent for the release of the cured molding compound from a mold in an amount of between about 0.01 and about 2 percent by weight of compound;
      (e) between about 50 and 85 percent by weight of compound of a filler; and
      (f) a flame retardant system of:
         (1) from about 0.40 to about 0.80% antimony pentoxide by weight of molding compound;
         (2) from about 0.01-1.0 percent sodium by weight of antimony pentoxide compound;
         (3) a reactive organic compound containing at least about 0.5% of bromine by weight of molding compound which may include one or more of the other components; and
         (4) from about 0.02 to about 4.0% magnesium aluminum carbonate hydrate by weight of molding compound.

2. The method of claim 1, wherein said epoxy is about 10-17 percent by weight of the epoxy molding compound.

3. The method of claim 1 wherein said hardener is a phenolic novolac.

4. The method of claim 1 wherein said hardener is an anhydride.

5. The method of claim 1 wherein said hardener is a polyanhydride of a maleic monomer and at least one alkyl styrene monomer or prepolymer of the polyanyhydride and the epoxy resin.

6. The method of claim 1 wherein said epoxy molding compound comprises at least about 50 weight percent of an inorganic filler.

7. The method of claim 1 wherein said inorganic filler includes silica.

8. The method of claim 1 wherein said epoxy molding compound comprises between about 60 and about 80 weight percent silica.

9. The method of claim 1 wherein said epoxy molding compound includes a silane coupling agent.

10. The method according to claim 1 wherein said epoxy molding compound includes a colorant.

11. The method of claim 1 wherein said reactive bromine-containing organic compound is a bromophenol-formaldehyde novolac.

12. The method of claim 1 wherein said reactive bromine-containing organic compound is a polyglycidyl ether of bromophenol-formaldehyde novolac.

13. The method according to claim 1, wherein said reactive bromine-containing organic compound is a bromophenol epoxy novolac.

14. The method according to claim 1, wherein said reactive bromine-containing organic compound is a meta-brominated cresol epoxy novolac.

15. The method according to claim 1, wherein said bromine-containing organic compound is part of said epoxy.

16. The method according to claim 1, wherein said bromine-containing organic compound is part of said phenol-derived or substituted phenol-derived resin hardener.

17. The method according to claim 1, wherein said reactive organic compound containing about 0.5–5.4 percent of bromine by weight of the molding compound.

18. The method according to claim 1, wherein said reactive organic compound containing about 0.5–2.2 percent of bromine by weight of the molding compound.

19. The method according to claim 1, wherein said reactive organic compound containing about 0.5–1.8 percent of bromine by weight of the molding compound.

20. The method according to claim 1, wherein the said flame retardant system contains about 0.03–0.06 percent of sodium by weight of the antimony pentoxide.

21. The method according to claim 1, wherein the said flame retardant system contains about 0.02–3.20 percent of magnesium aluminum carbonate hydrate by weight of the molding compound.

22. The method of claim 1 wherein said semiconductor device is a treated silicon wafer.

23. The method of claim 1 wherein said semiconductor device is selected from the group consisting of transistors, diodes and integrated circuits.

* * * * *

UNITED STATES PATENT AND TRADEMARK OFFICE
CERTIFICATE OF CORRECTION

PATENT NO. : 5,104,604

DATED : April 14, 1992

INVENTOR(S) : Anthony A. Gallo

It is certified that error appears in the above-identified patent and that said Letters Patent is hereby corrected as shown below:

At col. 11, line 18, amend "Table 3" to --Table 4--.

Signed and Sealed this

Twentieth Day of July, 1993

Attest:

MICHAEL K. KIRK

*Attesting Officer*     Acting Commissioner of Patents and Trademarks